United States Patent [19]

Miyamoto et al.

[11] Patent Number: 5,093,589
[45] Date of Patent: Mar. 3, 1992

[54] CHARGE INJECTION CIRCUIT HAVING IMPEDANCE CONVERSION MEANS

[75] Inventors: Yoshihiro Miyamoto, Atsugi; Kunihiro Tanikawa, Tama; Yuichiro Ito, Atsugi; Kazuya Kubo, Sagamihara; Nobuyuki Kajihara, Ebina; Isao Tofuku, Atsugi, all of Japan

[73] Assignee: Fujitsu Limited, Kawasaki, Japan

[21] Appl. No.: 670,384

[22] Filed: Mar. 15, 1991

Related U.S. Application Data

[63] Continuation of Ser. No. 242,266, Sep. 8, 1988, abandoned.

[30] Foreign Application Priority Data

| Sep. 14, 1987 | [JP] | Japan | 62-230252 |
| Sep. 14, 1987 | [JP] | Japan | 62-230254 |
| Sep. 14, 1987 | [JP] | Japan | 62-230257 |
| Sep. 19, 1987 | [JP] | Japan | 62-235628 |
| Sep. 19, 1987 | [JP] | Japan | 62-235629 |
| Oct. 26, 1987 | [JP] | Japan | 62-269974 |

[51] Int. Cl.$^5$ .......... H03K 17/687; H03K 3/42; G01J 5/00; H01L 25/00
[52] U.S. Cl. .......... 307/580; 307/584; 307/311; 328/2; 250/332; 357/24; 377/57
[58] Field of Search .......... 307/571, 575, 577, 580, 307/583, 584, 444, 311, 607; 328/2; 250/330, 332, 334; 357/24; 377/57-63

[56] References Cited

U.S. PATENT DOCUMENTS

| 3,566,131 | 2/1971 | Kelly | 307/311 |
| 3,621,283 | 11/1971 | Teer | 307/311 |
| 3,742,830 | 7/1973 | Matsuzaki et al. | 307/311 |
| 3,808,435 | 4/1974 | Bate et al. | 250/332 |
| 4,072,863 | 2/1978 | Roundy | 250/334 |
| 4,142,207 | 2/1979 | McCormack et al. | 250/332 |
| 4,338,515 | 7/1982 | Herbst et al. | 307/311 |
| 4,379,232 | 4/1983 | Hopper | 250/332 |
| 4,675,887 | 6/1987 | Akiyama et al. | 377/58 |

FOREIGN PATENT DOCUMENTS

| 0035536 | 3/1977 | Japan | 377/60 |
| 0113630 | 7/1982 | Japan | 307/444 |
| 0107634 | 6/1984 | Japan | 307/571 |

OTHER PUBLICATIONS

Kubo et al., "Feedback Direct Injection Current Readout for Infrared Charge-Couple Devices", *Infrared Technology* XV, SPIE vol. 1157, pp. xi, 329-337, 1989.
Nathan Bluzer et al., "Current Readout of Infrared Detectors", *Optical Engineering*, vol. 26, No. 3, pp. 241-248, Mar. 1987.

Primary Examiner—Stanley D. Miller
Assistant Examiner—Trong Phan
Attorney, Agent, or Firm—Staas & Halsey

[57] ABSTRACT

A charge injection circuit for injecting a charge to a signal processing circuit has a photo-voltaic element for generating a photocurrent when an infrared light is received, a field effect transistor used for injecting the charge to the signal processing circuit, and an impedance conversion circuit for feeding back an output of the field effect transistor to a substrate potential of the photo-voltaic element. The impedance conversion circuit has a gain which is greater than zero and less than or equal to one.

22 Claims, 18 Drawing Sheets

FIG. 1A (PRIOR ART)
FIG. 1B (PRIOR ART)
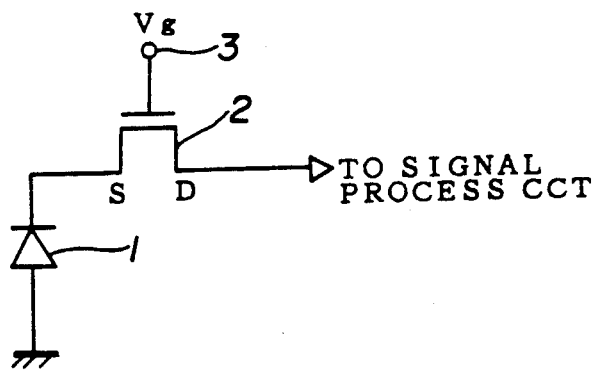
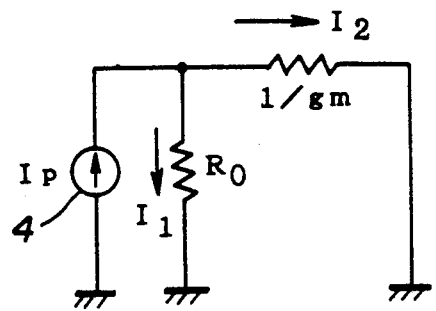
FIG. 2 (PRIOR ART)
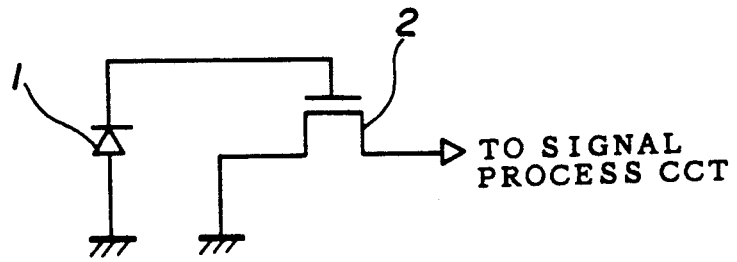

FIG. 3A (PRIOR ART)
FIG. 3B (PRIOR ART)
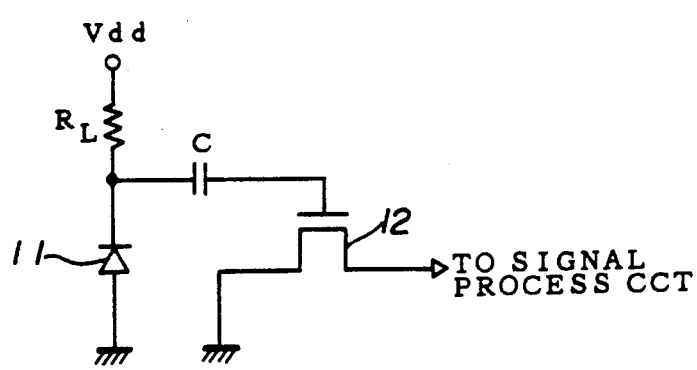
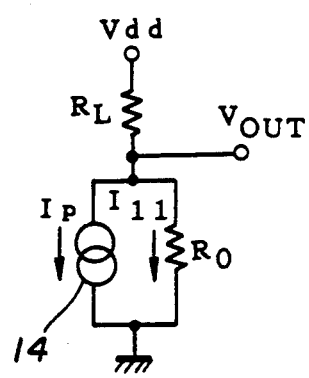
FIG. 4 (PRIOR ART)
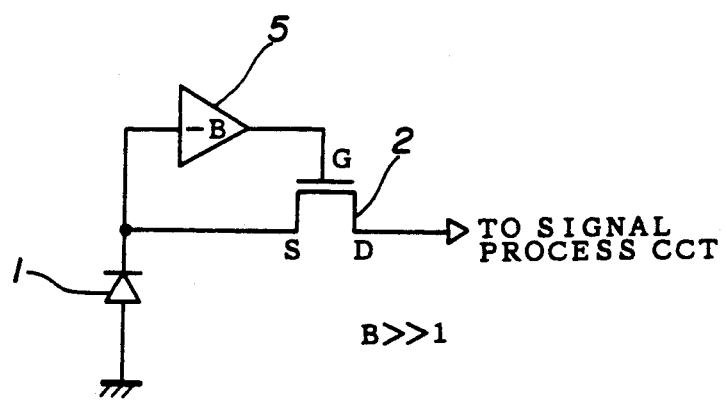
$B \gg 1$

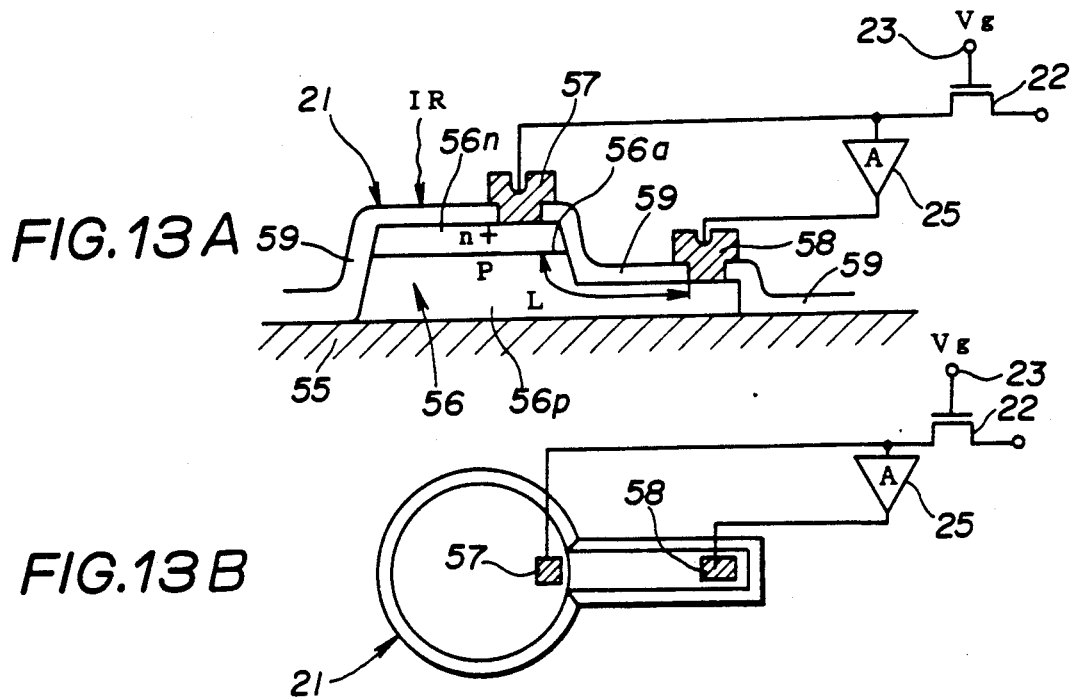
FIG.13A
FIG.13B
FIG.14
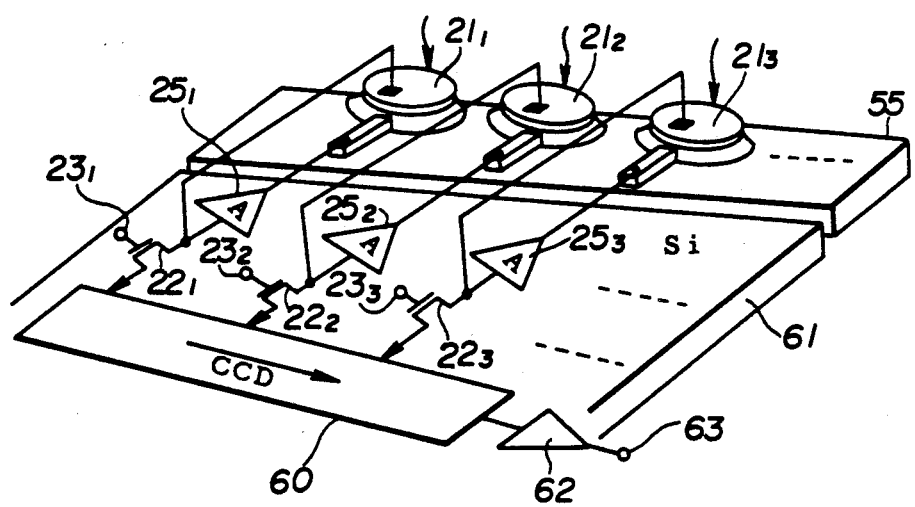

FIG.15 A
FIG.15 B
FIG.16 A
FIG.16 B
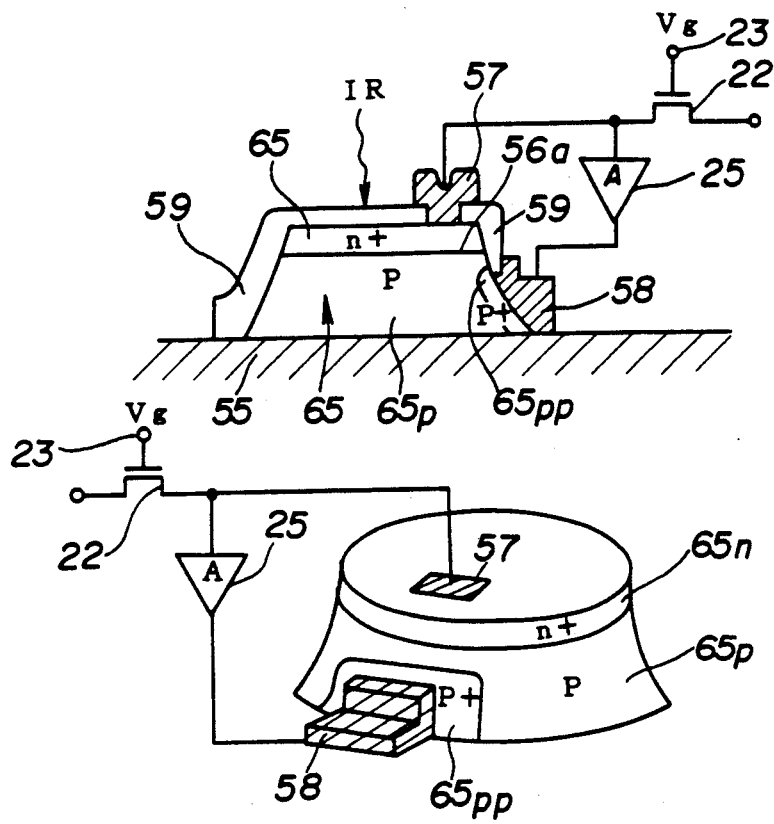
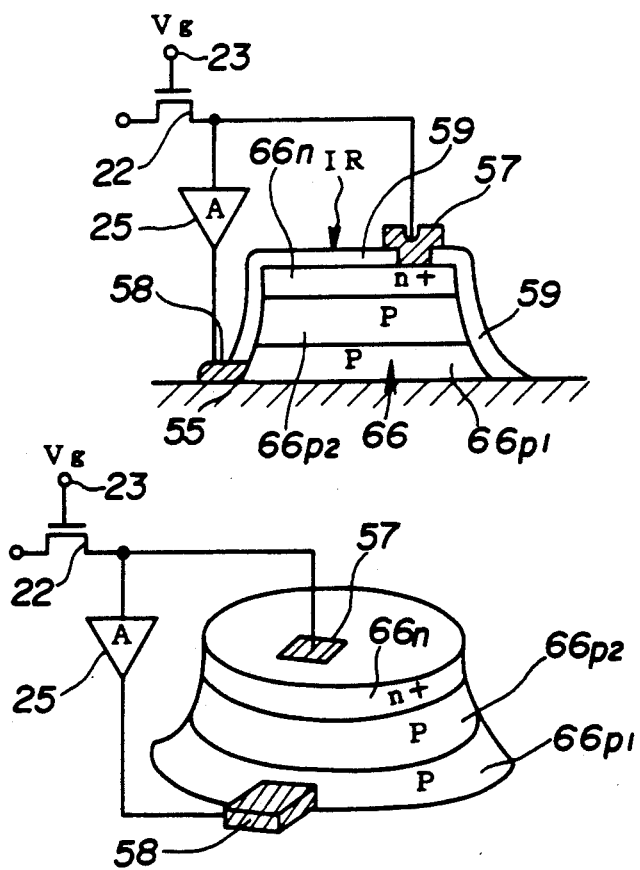

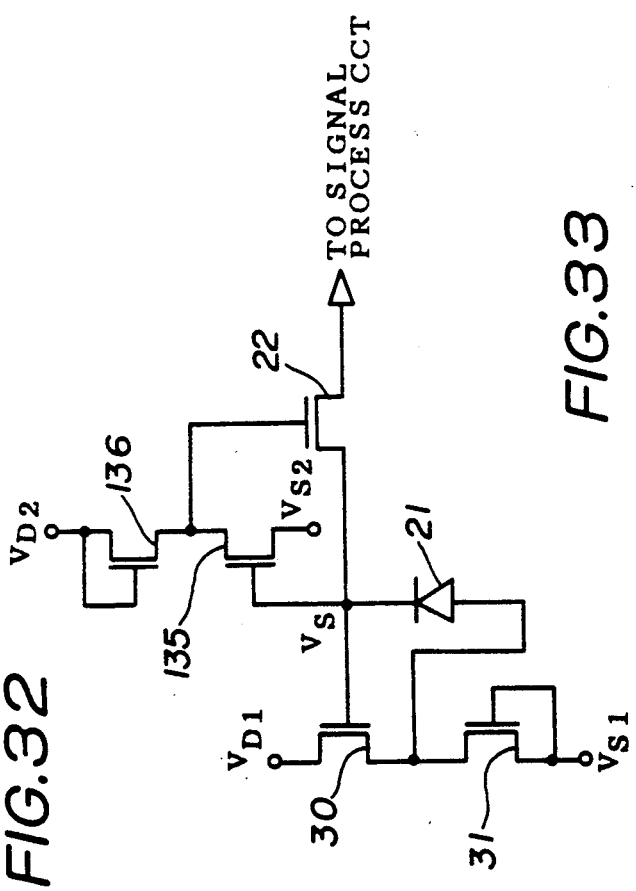
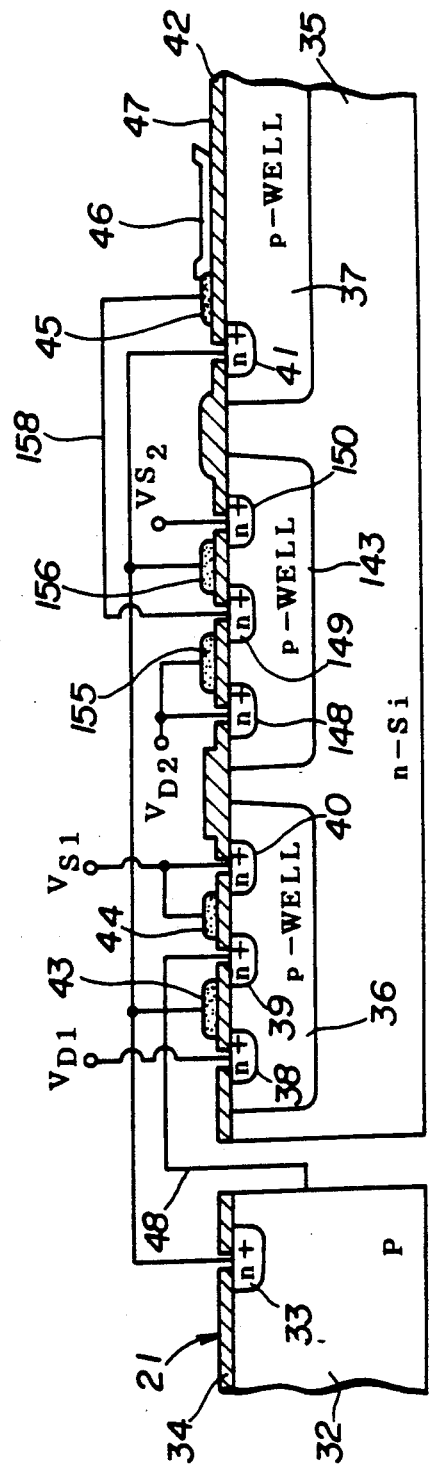

CHARGE INJECTION CIRCUIT HAVING IMPEDANCE CONVERSION MEANS

This application is a continuation of application Ser. No. 07/242,266, filed Sept. 8, 1988, now abandoned.

FIELD OF THE INVENTION

The present invention generally relates to charge injection circuits, and more particularly to a charge injection circuit for an infrared detector element which carries out a signal multiplexing within the element by coupling a photo-voltaic element and a signal processing circuit.

DESCRIPTION OF THE RELATED ART

An infrared detector element which carries out a signal multiplexing within the element by coupling a photo-voltaic element and a signal processing circuit such as a charge coupled device (CCD) is the center of attention as the infrared detector element of the next generation, and active research is made on the infrared detector element.

In the infrared detector element, a charge (photocurrent) which is obtained by the photoelectric conversion carried out in the photo-voltaic element is injected to the signal processing circuit through a field effect transistor (FET). Thus, the injection efficiency of a charge injection circuit is very important in the infrared detector element. In order to obtain an infrared detector element having a satisfactory sensitivity, it is necessary to improve the injection efficiency by improving an internal resistance of the photo-voltaic element and an input conductance of the FET.

FIG. 1A shows a first example of a conventional charge injection circuit. This charge injection circuit is referred to as a "direct injection type" because a cathode of a photo-voltaic element 1 is directly connected to a source diffusion layer of a metal oxide semiconductor (MOS) type FET 2. A gate of the FET 2 is applied with a gate voltage Vg through an input terminal 3. In addition, a drain of the FET 2 is connected to a signal processing circuit (not shown) such as a CCD to which the charge is to be injected.

FIG. 1B shows an A.C. equivalent circuit diagram of the direct injection type charge injection circuit shown in FIG. 1A. In FIG. 1B, a current source 4 of the photo-voltaic element 1 generates a photocurrent $I_P$ when the photo-voltaic element 1 receives an infrared light. The photocurrent $I_P$ is divided into an internal resistance $R_0$ of the photo-voltaic element 1 and an input impedance $1/gm$ which is an inverse number of a mutual conductance $gm$ of the FET 2.

A charge corresponding to a current $I_2$ which flows through the input impedance $1/gm$ is injected to the signal processing circuit. When a current which flows through the internal resistance $R_0$ is denoted by $I_1$, the current $I_2$ can be described by the following formula (1), where $gm \cdot R_0/(1+gm \cdot R_0)$ is the injection efficiency.

$$I_2 = gm \cdot R_0 \cdot I_P/(1+gm \cdot R_0) \qquad (1)$$

Because the band gap of the photo-voltaic element 1 is narrow, the internal resistance $R_0$ is a relatively small resistance in the order of 10 kΩ to 1 GΩ. Moreover, the internal resistance $R_0$ greatly decreases as the cutoff wavelength of the photo-voltaic element 1 becomes long and the ambient temperature becomes high.

On the other hand, the input impedance $1/gm$ is normally dependent on the shape, that is, the width-to-length ratio of the FET 2. Under the normal operating condition, however, the operating region of the FET is in the weak inversion state, and the input impedance $1/gm$ is virtually independent of the width-to-length ratio of the FET 2 with respect to a current having a minute level in the weak inversion state.

Therefore, as may be seen from the formula (1) described above, the charge corresponding to the current $I_2$ injected to the signal processing circuit is considerably small, and the conventional charge injection circuit suffers problems in that the injection efficiency is poor and the sensitivity of the infrared detector element accordingly becomes poor.

FIG. 2 shows a second example of a conventional charge injection circuit. In FIG. 2, those parts which are essentially the same as those corresponding parts in FIG. 1A are designated by the same reference numerals, and a description thereof will be omitted. This charge injection circuit is referred to as a "gate input type" because the cathode of the photo-voltaic element 1 is directly connected to the gate of the FET 2. The source of the FET 2 is grounded, and the drain of the FET 2 is connected to the signal processing circuit (not shown) to which the charge is to be injected.

In the infrared detector element, the charge (photocurrent) obtained by the photoelectric conversion in the photo-voltaic element is injected to the signal processing circuit and it is important that a signal-to-noise (S/N) ratio thereof is large. In the conventional charge injection circuit shown in FIG. 2, the photo-voltaic element 1 generates the photocurrent when the infrared light is received, and the gate of the FET 2 is applied with a voltage which is determined by a product of the internal resistance $R_0$ of the photo-voltaic element 1 and the photocurrent. Hence, the charge corresponding to the drain current of the FET 2 is injected to the signal processing circuit. In the gate input type charge injection circuit, the charge injected to the signal processing circuit is not directly related to the quantity of the infrared light received by the photo-voltaic element 1, and the relationship between the injected charge and the quantity of received infrared light is described by an exponential function.

However, although the conventional charge injection circuit uses the photo-voltaic effect, that is, an open voltage of the photo-voltaic element 1, the signal conversion is extremely faint because of the extremely small open voltage which is in the order of mV. As a result, there is a problem in that the S/N ratio of the charge supplied to the signal processing circuit is poor. It is possible to conceive an arrangement wherein the open voltage is increased by providing an amplifier between the cathode of the photo-voltaic element 1 and the gate of the FET 2, but such an arrangement will result in a large power consumption and it will be necessary to match operating points.

FIG. 3A shows a third example of a conventional charge injection circuit. The charge injection circuit has a photo-voltaic element 11, a MOS type FET 12, a load resistance $R_L$ and a capacitor C for providing an A.C. coupling between a gate of the FET 12 and a node connecting a cathode of the photo-voltaic element 11 and the load resistance $R_L$. This charge injection circuit is referred to as a "gate coupling type" because an A.C. component of an output voltage of the photo-voltaic element 11 is applied to the gate of the FET 12. A source of the FET 12 is grounded, and a drain of the FET 12 is connected to a signal processing circuit (not shown) such as a CCD to which the charge is to be injected.

FIG. 3B shows an equivalent circuit of a circuit portion of the charge injection circuit shown in FIG. 3A including the photo-voltaic element 11 and the load resistance $R_L$. In FIG. 3B, a current source 14 of the photo-voltaic element 11 generates a photocurrent $I_P$ when the photo-voltaic element 11 receives an infrared light. The current source 14 is connected in parallel to the internal resistance $R_0$ thereof and is connected in series to the load resistance $R_L$. Vdd denotes a power source voltage and $V_{OUT}$ denotes an output voltage supplied to the gate of the FET 12.

In FIG. 3B, no current flows to the gate of the FET 12 from a node connecting the load resistance $R_L$, the current source 14 and the internal resistance $R_0$. Hence, a current $I_{11}$ which flows through the internal resistance $R_0$ can be described by the following formula (2).

$$Vdd = R_L \cdot (I_{11} + I_P) + R_0 \cdot I_{11} \quad (2)$$

Since the formula (2) can be rewritten for $I_{11}$ as the following formula (3), the output voltage $V_{OUT}$ can be described by the formula (4).

$$I_{11} = (Vdd - R_L \cdot I_P)/(R_L + R_0) \quad (3)$$

$$V_{OUT} = R_0 \cdot I_{11} = (Vdd - R_L \cdot I_P)/[1 + (R_L/R_0)] \quad (4)$$

Therefore, in the charge injection circuit shown in FIG. 3A, the photo-voltaic element 11 generates the photocurrent $I_P$ depending on the received infrared light and the output voltage $V_{OUT}$ described by the formula (4) is obtained from the cathode of the photo-voltaic element 11. However, only an A.C. component of the output voltage $V_{OUT}$ is applied to the gate of the FET 12 due to the provision of the capacitor C, and as a result the drain current flowing through the FET 12 is injected to the signal processing circuit. The charge (current) injected to the signal processing circuit corresponds to the A.C. component of the output voltage $V_{OUT}$ of the photo-voltaic element 11.

In order to set a voltage varying range of the output voltage $V_{OUT}$ of the photo-voltaic element 11 to a large range, it is necessary to set the load resistance $R_L$ to a large value. But when the load resistance $R_L$ is set to a large value, a relation $R_L/R_0 \gg 1$ stands because the internal resistance $R_0$ of the photo-voltaic element 11 is extremely small. Thus, as may be seen from the formula (4), it is impossible to obtain a sufficiently large output voltage $V_{OUT}$, and there is a problem in that the S/N ratio of the output signal of the FET 12 is poor.

FIG. 4 shows a fourth example of a conventional charge injection circuit. In FIG. 3, those parts which are essentially the same as those corresponding parts in FIG. 1A are designated by the same reference numerals, and a description thereof will be omitted. The charge injection circuit shown in FIG. 4 has a negative feedback amplifier 5 for applying the source potential of the FET 2 to the gate of the FET 2. This charge injection circuit is disclosed in Nathan Bluzer et al., "Current Readout of Infrared Detectors", Optical Engineering, Vol. 26, No. 3, pp. 241-248, March 1987.

A current $I_2$ flowing between the drain and source of the FET 2 can be described by the following formula (5), where $I_P$ denotes the photocurrent flowing through the photo-voltaic element 1, $-B$ ($B \gg 1$) denotes the gain of the negative feedback amplifier 5, $R_0$ denotes the internal resistance of the photo-voltaic element 1 and gm denotes the mutual conductance of the FET 2.

$$I_2 = [(1+B) \cdot gm \cdot R_0 \cdot I_P]/[1 + (1+B) \cdot gm \cdot R_0] \quad (5)$$

According to this charge injection circuit, the injection efficiency is improved compared to the charge injection circuit shown in FIG. 1A because the conductance gm is effectively improved to (1+B) times that of the charge injection circuit shown in FIG. 1A. However, there is a demand to further improve the injection efficiency.

SUMMARY OF THE INVENTION

Accordingly, it is a general object of the present invention to provide a novel and useful charge injection circuit in which the problems described heretofore are eliminated.

Another and more specific object of the present invention is to provide a charge injection circuit of the first type for injecting a charge to a signal processing circuit comprising a photo-voltaic element for generating a photocurrent when an infrared light is received, a field effect transistor having a source thereof connected to the photo-voltaic element for injecting the charge to the signal processing circuit which is coupled to a drain thereof, where the field effect transistor has a gate supplied with a gate voltage, and an impedance conversion circuit for feeding back a source potential of the field effect transistor to a substrate potential of the photo-voltaic element. The impedance conversion circuit has a gain which is greater than zero and less than or equal to one. According to the charge injection circuit of the present invention, it is possible to greatly improve the injection efficiency and the circuit is suited for application to an infrared detector for detecting an infrared light having a long wavelength and an infrared detector which is used under a high temperature.

Still another object of the present invention is to provide a charge injection circuit of the above described first type which additionally has a lowpass filter provided in a feedback path between the impedance conversion circuit and the photo-voltaic element. According to the charge injection circuit of the present invention, it is possible to suppress the injection efficiency of a high frequency component of a white noise and thus improve the signal-to-noise ratio of the photo-voltaic element.

A further object of the present invention is to provide a charge injection circuit of the above described first type in which the photo-voltaic element has a semiconductor substrate, a first layer of a first semiconductor type and a second layer of a second semiconductor type formed on the semiconductor substrate and forming a pn junction interface, and an ohmic contact portion which connects to the impedance conversion circuit for receiving the feedback of the source potential, where the ohmic contact portion is located at a portion a diffusion length or more of minority carriers of the semiconductor substrate away from the pn junction interface. According to the charge injection circuit of the present invention, it is possible to suppress the generation of a dark current at the ohmic contact portion.

Another object of the present invention is to provide a charge injection circuit of the above described first type in which the photo-voltaic element has a semiconductor substrate, a first layer of a first semiuconductor type and a second layer of a second semiconductor type formed on the semiconductor substrate and forming a pn junction interface, a high carrier density layer of the first semiconductor type formed in the first layer and having a carrier density higher than that of the first layer, and an ohmic contact portion which connects to the impedance conversion circuit for receiving the feedback of the source potential, where the ohmic contact portion is in contact with the high carrier density layer. According to the charge injection circuit of the present invention, it is also possible to suppress the generation of the dark current at the ohmic contact portion.

Still another object of the present invention is to provide a charge injection circuit of the above described first type in which the photo-voltaic element has a semiconductor substrate, a semiconductor layer of a first semiconductor type having a wide band gap, a first layer of the first semiconductor type and a second layer of a second semiconductor type respectively having a narrow band gap formed on the semiconductor layer and forming a pn junction interface, and an ohmic contact portion which connects to the impedance conversion circuit for receiving the feedback of the source potential, where the ohmic contact portion is in contact with the semiconductor layer. According to the charge injection circuit of the present invention, it is also possible to suppress the generation of the dark current at the ohmic contact portion.

A further object of the present invention is to provide a charge injection circuit of the above described first type which further has m by n address switches $SW_{11}$ through $SW_{mn}$ which are sequentially turned ON in a sequence of a line address, where the address switches of identical line addresses are turned ON simultaneously. The photo-voltaic element, the field effect transistor and the impedance conversion circuit are arranged in an array having m by n photo-voltaic elements $PV_{11}$ through $PV_{mn}$, n field effect transistors and n impedance conversion circuits, and a photocurrent generated from the photo-voltaic elements $PV_{1j}$ through $PV_{mj}$ is supplied to a source of a corresponding field effect transistor through one of the address switches $SW_{1j}$ through $SW_{mj}$ which is ON, where $j=1, \ldots, n$. It is possible to further provide a single substrate and n detector element substrates $SUB_1$ through $SUB_n$, where the photo-voltaic elements $PV_{1j}$ through $PV_{mj}$ arranged in a direction perpendicular to a line address direction are provided on a common detector element substrate $SUB_j$ out of the n detector element substrates, where $j=1, \ldots, n$, so that the photo-voltaic elements arranged in the line address direction are provided on mutually different detector element substrates. In this case, the address switches, the impedance conversion circuits and the field effect transistors are provided on the single substrate, with each impedance circuit making a positive feedback to a corresponding one of the detector element substrates. According to the charge injection circuit of the present invention, the construction becomes simple although the elements are arranged in the array.

Another object of the present invention is to provide a charge injection circuit of a second type for injecting a charge to a signal processing circuit comprising a photo-voltaic element for generating a photocurrent when an infrared light is received, a field effect transistor having a gate thereof connected to the photo-voltaic element for injecting the charge to the signal processing circuit from a drain thereof, where the field effect transistor has a source which is grounded, and an impedance conversion circuit for feeding back a potential at a node connecting the photo-voltaic element and the gate of the field effect transistor to a substrate potential of the photo-voltaic element. The impedance conversion circuit has a gain which is greater than zero and less than or equal to one. According to the charge injection circuit of the present invention, it is possible to improve the signal-to-noise ratio of the signal injected to the signal processing circuit.

Still another object of the present invention is to provide a charge injection circuit of the third type for injecting a charge to a signal processing circuit comprising a photo-voltaic element for generating a photocurrent when an infrared light is received, a load connected between a power source voltage and the photo-voltaic element for biasing the photo-voltaic element, a capacitor having one terminal connected to a node connecting the photo-voltaic element and the load, a field effect transistor having a gate thereof connected to another terminal of the capacitor for injecting the charge to the signal processing circuit from a drain thereof, where the field effect transistor has a source which is grounded, and an impedance conversion circuit for feeding back an output voltage of the photo-voltaic element to a substrate potential of the photo-voltaic element. The impedance conversion circuit has a gain which is greater than zero and less than or equal to one. According to the charge injection circuit of the present invention, it is possible to obtain a large output voltage from the photo-voltaic element even when the cutoff wavelength of the photo-voltaic element is long or the photo-voltaic element is used under a high temperature, and thus improve the signal-to-noise ratio of the signal injected to the signal processing circuit.

A further object of the present invention is to provide a charge injection circuit of a fourth type for injecting a charge to a signal processing circuit comprising a photo-voltaic element for generating a photocurrent when an infrared light is received, a field effect transistor having a source thereof connected to the photo-voltaic element for injecting the charge to the signal processing circuit which is coupled to a drain thereof, an impedance conversion circuit for feeding back a source potential of the field effect transistor to a substrate potential of the photo-voltaic element, where the impedance conversion circuit has a gain which is greater than zero and less than or equal to one, and a negative feedback amplifier connected between a gate of the field effect transistor and a node connecting the photo-voltaic element and the impedance conversion circuit for making a negative feedback of the source potential to the gate of the field effect transistor. The negative feedback amplifier has a gain which is greater than one and less than infinity. According to the charge injection circuit of the present invention, it is possible to even further improve the injection efficiency to the signal processing circuit.

Other objects and further features of the present invention will be apparent from the following detailed description when read in conjunction with the accompanying drawings.

BRIEF DESCRIPTION OF THE DRAWINGS

FIG. 1A is a circuit diagram showing a first example of a conventional charge injection circuit;

FIG. 1B is an A.C. equivalent circuit diagram of the charge injection circuit shown in FIG. 1A;

FIG. 2 is a circuit diagram showing a second example of a conventional charge injection circuit;

FIG. 3A is a circuit diagram showing a third example of a conventional charge injection circuit;

FIG. 3B is an equivalent circuit diagram of a circuit portion of the charge injection circuit shown in FIG. 2A including a photo-voltaic element and a load resistance;

FIG. 4 is a circuit diagram showing a fourth example of a conventional charge injection circuit;

FIGS. 13A and 13B are a cross sectional view and a plan view respectively showing a third embodiment of the charge injection circuit according to the present invention;

FIG. 14 shows the third embodiment shown in FIGS. 13A and 13B arranged in an array;

FIGS. 15A and 15B are a cross sectional view and a perspective view respectively showing a fourth embodiment of the charge injection circuit according to the present invention;

FIGS. 16A and 16B are a cross sectional view and a perspective view respectively showing a fifth embodiment of the charge injection circuit according to the present invention;

FIG. 32 is a circuit diagram showing an embodiment of the circuit construction of the tenth embodiment shown in FIG. 29; and FIG. 33 is a cross sectional view showing the construction of an essential part of the circuit shown in FIG. 32.

DESCRIPTION OF THE PREFERRED EMBODIMENTS

Figure 5A:
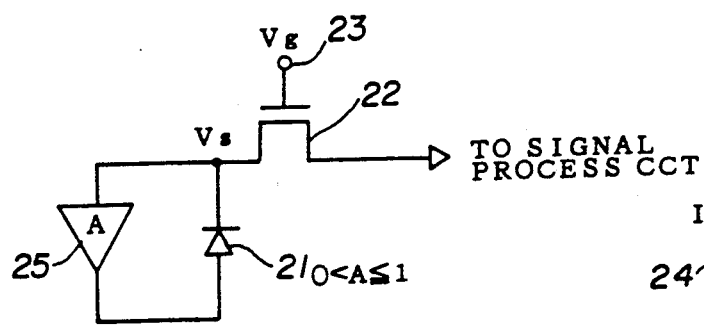
FIG. 5A is a circuit diagram showing a first embodiment of the charge injection circuit according to the present invention.

FIG. 5A shows a first embodiment of the charge injection circuit according to the present invention. A cathode of a photo-voltaic element 21 is directly connected to a source diffusion layer of a MOS type FET 22. A gate of the FET 22 is applied with a gate voltage Vg through an input terminal 23. In addition, a drain of the FET 22 is connected to a signal processing circuit (not shown) such as a CCD to which the charge is to be injected. Furthermore, an impedance conversion circuit 25 is connected between the cathode and anode of the photo-voltaic element 21. The impedance conversion circuit 25 has a gain A which is greater than zero and less than or equal to one. Hence, a source potential $V_S$ of the FET 22 is fed back to a substrate potential (anode) of the photo-voltaic element 21 through the impedance conversion circuit 25.

Figure 5B:
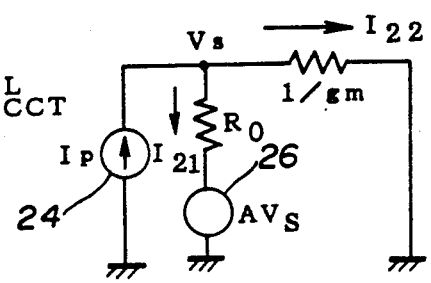
FIG. 5B is an A.C. equivalent circuit diagram of the charge injection circuit shown in FIG. 5A.

FIG. 5B shows an A.C. equivalent circuit diagram of the direct injection type charge injection circuit shown in FIG. 5A. A current source 24 of the photo-voltaic element 21 generates a photocurrent $I_P$ when the photo-voltaic element 21 receives an infrared light. The photocurrent $I_P$ is divided by an internal resistance $R_0$ of the photo-voltaic element 21 and an impedance $1/gm$ which is an inverse number of a mutual conductance $gm$ of the FET 22. A voltage source 26 corresponds to a voltage $AV_S$ which is obtained by a positive feedback of the source potential $V_S$ of the FET 22 to the substrate potential of the photo-voltaic element 21.

The following formulas (6), (7) and (8) stand in FIG. 5B, where $I_{21}$ denotes a current flowing through the internal resistance $R_0$ and $I_{22}$ denotes a current flowing through the impedance $1/gm$.

$$I_P = I_{21} + I_{22} \quad (6)$$

$$V_S = I_{22}/gm \quad (7)$$

$$V_S = R_0 \cdot I_{21} + A \cdot V_S \quad (8)$$

The formulas (6) through (8) can be solved for $I_{22}$ as may be seen from the following formula (9).

$$I_{22} = I_P/[1+(1-A)/(gm \cdot R_0)] = [gm \cdot R_0/(1-A) \cdot I_P]/[1+gm \cdot R_0/(1-A)] \quad (9)$$

It can be seen from the formula (9) that in the injection current $I_{22}$ of this embodiment the internal resistance $R_0$ is $1/(1-A)$ times that of the first example of the conventional charge injection circuit described before in conjunction with FIGS. 1A and 1B. Since A is greater than zero and less than or equal to one, $I_{22} = I_P$ and $I_{21} = 0$ when $A = 1$, for example. Hence, a maximum injection current $I_{22}$ is obtained when $A = 1$.

Figure 6:
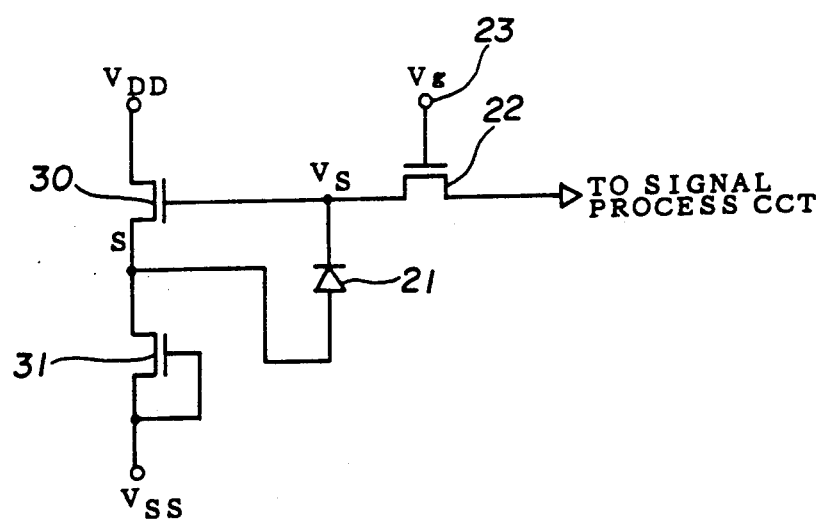
FIG. 6 is a circuit diagram showing an embodiment of the circuit construction of the first embodiment shown in FIG. 5A.

FIG. 6 shows an embodiment of the circuit construction of the first embodiment. In FIG. 6, those parts which are the same as those corresponding parts in FIG. 5A are designated by the same reference numerals, and a description thereof will be omitted. The impedance conversion circuit 25 has a MOS type FET 30. A gate of the FET 30 is connected to the source of the FET 22 and to the cathode of the photo-voltaic element 21. A MOS type FET 31 acts as a load on the FET 30 and a gate and a source of the FET 31 are connected to each other. A drain of the FET 31 is connected to a node connecting a source of the FET 30 and the photo-voltaic element 21. $V_{DD}$ and $V_{SS}$ denote respective power source voltages to the drain of the FET 30 and the source of the FET 31.

Figure 7:
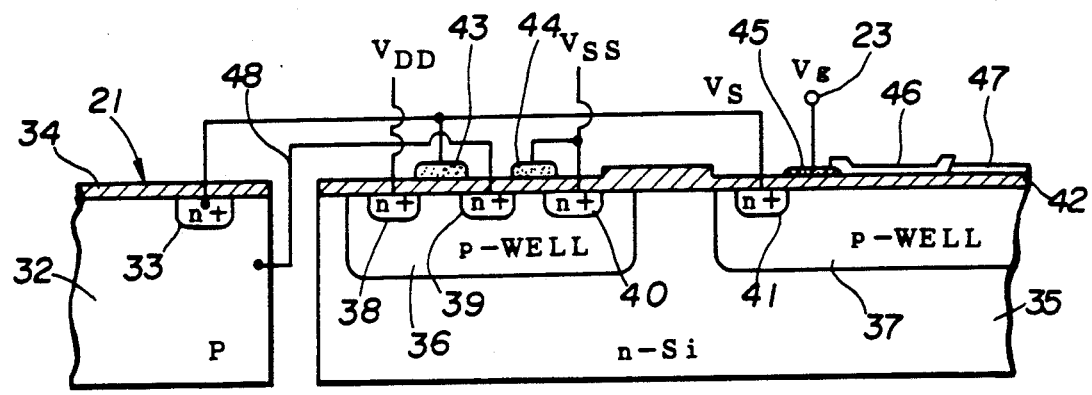
FIG. 7 is a cross sectional view showing the construction of an essential part of the circuit shown in FIG. 6.

FIG. 7 shows a cross sectional view of the construction of an essential part of the circuit shown in FIG. 6. The photo-voltaic element 21 has a p-type substrate 32, an n+-type diffusion layer 33 formed in the p-type substrate 32, and an insulator layer 34 formed on the p-type substrate 32. The p-type substrate 32 is made of indium antimony (InSb), lead tin telluride (PbSnTe), mercury cadmium telluride (HgCdTe) or the like. In addition, the insulator layer 34 is made of silicon dioxide (SiO$_2$), zinc sulfide (ZnS) or the like.

On the other hand, two p-type wells 36 and 37 are formed in an n-type silicon (Si) substrate 35, and n+-type diffusion layers 38, 39 and 40 are formed within the p-type well 36. In addition, an n+-type diffusion layer 41 is formed within the other p-type well 37. The n+-type diffusion layer 41 constitutes a source region of the FET 22 and also constitutes the input diode together with the p-type well 37.

An oxide layer 42 made of SiO$_2$, for example, is formed by a known means on the n-type Si substrate 35 which is already formed with the regions described above. In addition, gate electrodes 43 and 44 made of polysilicon or the like, an input gate electrode 45, a storage gate 46, an electrode 47 which constitutes a part of the signal processing circuit (CCD) are thereafter formed on the n-type Si substrate 35.

The drain of the FET 22 corresponds to the region of the p-type well 37 immediately below the storage gate 46, and the gate of the FET 22 corresponds to the input gate electrode 45. In addition, the drain of the FET 30 corresponds to the n+-type diffusion layer 38. Because the source of the FET 30 and the drain of the FET 31 always have the same potential, the n+-type diffusion layer 39 is used in common as the source of the FET 30 and the drain of the FET 31. The source of the FET 31 corresponds to the n+-type diffusion layer 40.

The photocurrent generated when the photo-voltaic element 21 receives the infrared light is supplied from the n+-type diffusion layer 33 to the n+-type diffusion layer 41. The photocurrent supplied to the n+-type diffusion layer 41 then passes through the region of the p-type well 37 immediately below the input gate electrode 45 and is stored as a signal charge in the potential well of the region of the p-type well 37 immediately below the storage gate 46. The n+-type diffusion layer 41, the potential well immediately below the electrode 46 and the gate electrode 45 substantially constitute the FET 22. The signal charge is thereafter transferred to the signal processing circuit (CCD).

The source potential $V_S$ at the n+-type diffusion layer 41 is fed back to the p-type substrate 32 of the photo-voltaic element 21 through the gate electrode 43, the n+-type diffusion layer 39 and a connection line 48. Accordingly, the injection efficiency of this embodiment is greatly improved compared to that of the conventional charge injection circuit. For example, the FETs 30 and 31 constitute a source follower and the gain A of the impedance conversion circuit 25 is approximately 0.9. Hence, as may be understood from the formula (9), the value of the internal resistance $R_0$ is improved to over ten times that of the conventional charge injection circuit.

Figure 8:
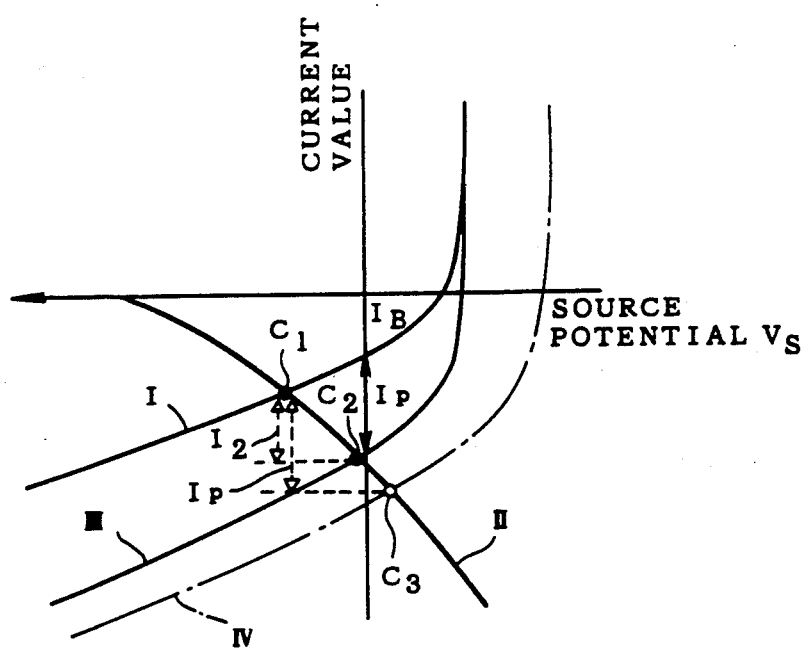
FIG. 8 shows a voltage versus current characteristic for explaining an injection efficiency.

FIG. 8 shows a voltage versus current characteristic for explaining the injection efficiency. In the case where no infrared light is received by the photo-voltaic element 21 from the subject of the detection, the source potential $V_S$ and the current of the photo-voltaic element 21 have a relationship indicated by a solid line I in FIG. 8. In this case, even when there is no subject of detection, a D.C. current $I_B$ is generated by the background light and the like.

On the other hand, in the case where the input gate voltage $V_g$ is a predetermined constant value, the input source potential $V_S$ of the FET 22 and the current of the photo-voltaic element 21 have a relationship indicated by a solid line II in FIG. 8. An intersection C1 of the characteristics (curves) I and II is the operating point for the case where there is no subject of detection.

In the case where the infrared light is received by the photo-voltaic element from the subject of detection in the conventional charge injection circuit, the source potential $V_S$ and the current of the photo-voltaic element have a relationship indicated by a solid line III in FIG. 8. It can be seen that the characteristic III is obtained by shifting the characteristic I by the quantity of the photocurrent $I_P$ parallel with respect to the current axis. Thus, the operating point in this case is located at a position C2 and the injection current is increased by the quantity of the current $I_{22}$ compared to the operating point C1 for the case where there is no subject of detection.

On the other hand, in the case where the infrared light is received by the photo-voltaic element 21 from the subject of detection in this embodiment of the charge injection circuit, the source potential $V_S$ and the current of the photo-voltaic element 21 have a relationship indicated by a one-dot chain line IV in FIG. 8. It can be seen that the source potential $V_S$ is reduced compared to that of the conventional charge injection circuit, and the substrate potential of the photo-voltaic element 21 is also shifted to a smaller value at a certain gain. The operating point in this embodiment is thus located at a position C3, and the injection current is $I_P$ ($>I_{22}$) and large compared to the case where there is no incoming infrared light. Therefore, according to this embodiment, the operating point is varied depending on the photocurrent $I_P$ by feeding back the source potential $V_S$ of the FET 22 to the substrate potential of the photo-voltaic element 21. Further, according to this embodiment, the injection efficiency is greatly improved compared to that of the conventional charge injection circuit.

Figure 9:
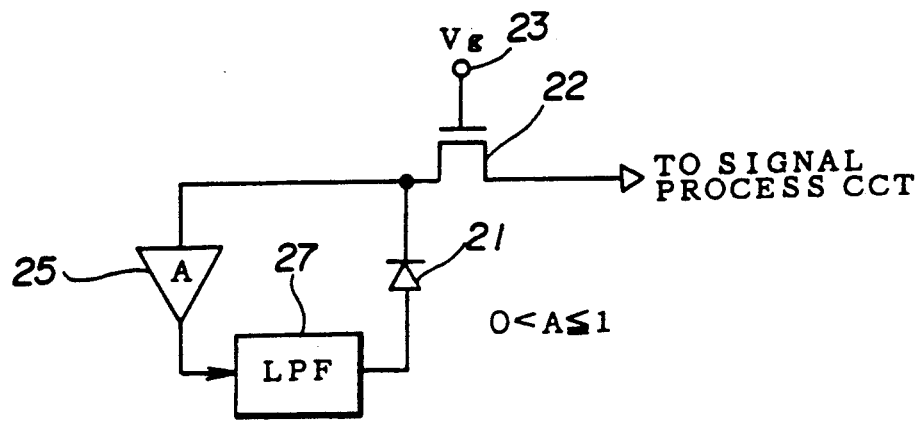
FIG. 9 is a circuit diagram showing a second embodiment of the charge injection circuit according to the present invention.

Next, a description will be given on a second embodiment of the charge injection circuit according to the present invention, by referring to FIG. 9. In FIG. 9, those parts which are essentially the same as those corresponding parts in FIG. 5A are designated by the same reference numerals, and a description thereof will be omitted. In this embodiment, a lowpass filter 27 is connected between the impedance conversion circuit 25 and the anode of the photo-voltaic element 21. In other words, the source potential $V_S$ of the FET 22 is fed back to the substrate potential of the photo-voltaic element 21 through the impedance conversion circuit 25 and the lowpass filter 27 which is provided in the feedback path. The lowpass filter 27 reduces the feedback gain in the high frequency region to reduce the injection efficiency in the high frequency region and accordingly improve the S/N ratio of the photo-voltaic element 21.

In other words, the first embodiment shown in FIG. 5A also has a high injection efficiency with respect to a white noise which is the dominant noise in the ideal photo-voltaic element 21. For this reason, the sensitivity of the infrared detector element is improved and the S/N ratio is improved with respect to external noise, but the first embodiment does not contribute to the improvement of the S/N ratio of the photo-voltaic element 21.

The white noise is added and amplified by the aliasing effect when the multiplexing takes place in for example a horizontal transfer register within the signal processing circuit. As a result, the white noise greatly deteriorates the S/N ratio of an output video signal of the horizontal transfer register.

Accordingly, in the second embodiment, the lowpass filter 27 reduces the injection efficiency of the high frequency component. The injection current $I_{22}$ in FIG. 9 can be described by the following formula (10).

$$I_{22}=[gm\cdot R_0/(1-A)\cdot I_0]/[1+gm\cdot R_0/(1-A)] \quad (10)$$

The internal resistance $R_0$ greatly decreases when the photo-voltaic element 21 has a long cutoff wavelength or the photo-voltaic element 21 operates under a high temperature, and thus, $gm\cdot R_0 \approx 1$ in such a case. Hence, when A=0.9, it can be seen from the formula (10) by substituting $gm\cdot R_0=1$ that the injection efficiency in the passband of the lowpass filter 27 is 91%.

On the other hand, it may substantially be regarded that $A \approx 0$ in the high frequency region blocked by the lowpass filter 27, and the injection efficiency in this case is 50%. Accordingly, by selecting the cutoff frequency (corner frequency) of the lowpass filter 27 to a value which passes the input signal, it is possible to suppress the high frequency white noise to approximately one-half.

Figure 10:
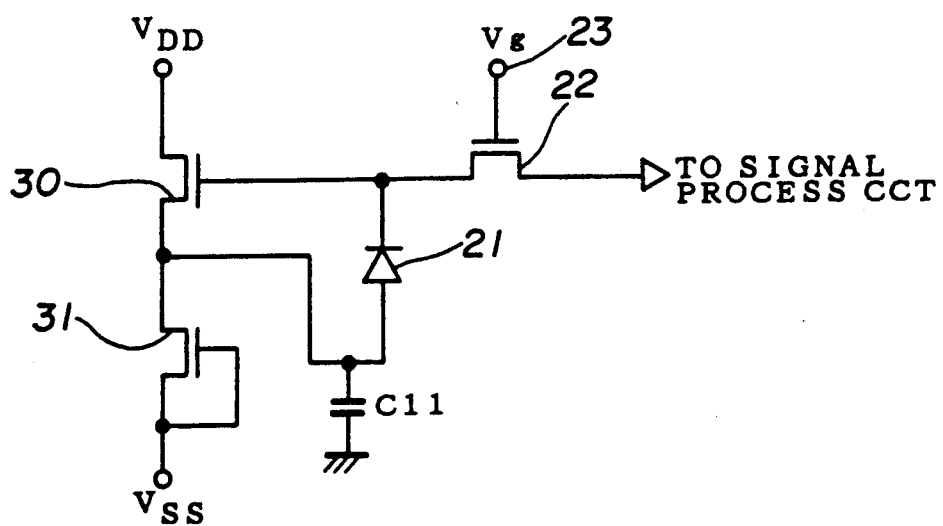
FIG. 10 is a circuit diagram showing an embodiment of the circuit construction of the second embodiment shown in FIG. 9.

FIG. 10 shows an embodiment of the circuit construction of the second embodiment. In FIG. 10, those parts which are the same as those corresponding parts in FIG. 6 are designated by the same reference numerals, and a description thereof will be omitted.

Figure 11:
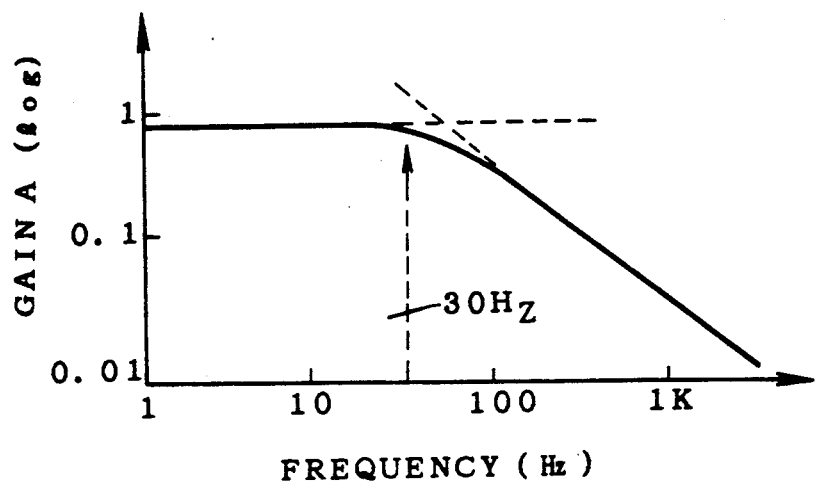
FIG. 11 shows a filter characteristic of the circuit shown in FIG. 10.

In FIG. 10, one end of a capacitor $C_{11}$ is connected to the anode (substrate) of the photo-voltaic element 21, and the other end of the capacitor $C_{11}$ is grounded. Hence, the lowpass filter 27 which has a filter characteristic shown in FIG. 11 with respect to the voltage obtained from the source of the FET 30 is constituted by the capacitor $C_{11}$, the impedance of the FET 31 and the impedance of the FET 30 of the source follower.

Figure 12:
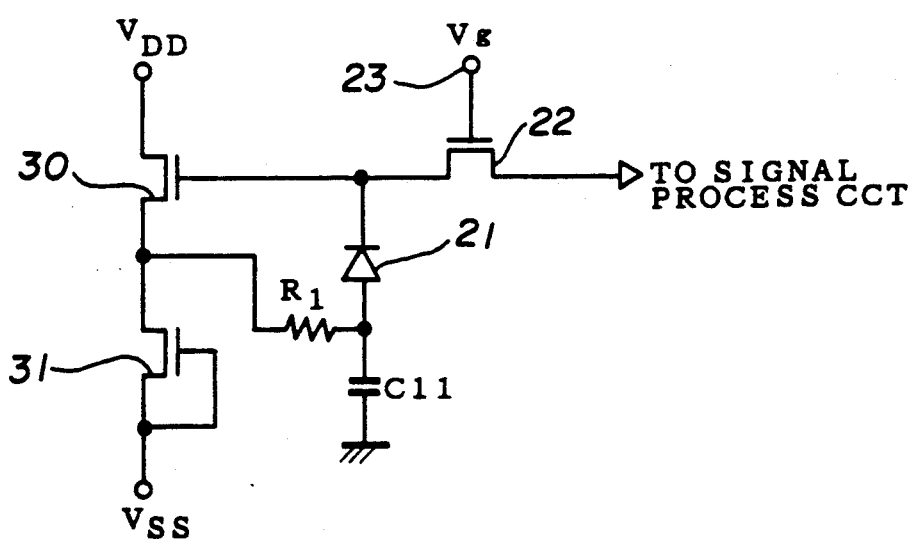
FIG. 12 is a circuit diagram showing another embodiment of the circuit construction of the second embodiment shown in FIG. 9.

FIG. 12 shows another embodiment of the circuit construction of the second embodiment. In FIG. 12, those parts which are the same as those corresponding parts in FIG. 10 are designated by the same reference numerals, and a description thereof will be omitted.

In FIG. 12, one end of a resistor $R_1$ is connected to the source of the FET 30 and the drain of the FET 31, while the other end of the resistor $R_1$ is connected to the capacitor $C_{11}$ and the substrate of the photo-voltaic element 21. The resistor $R_1$ restricts the frequency characteristic of the lowpass filter 27. The lowpass filter characteristic can be realized without the use of the resistor $R_1$, but the terminal voltage of the capacitor $C_{11}$ stabilizes when the resistor $R_1$ is used. As in the case of the embodiment of the circuit construction shown in FIG. 10, the source potential $V_S$ is fed back to the substrate potential of the photo-voltaic element 21 through the lowpass filter 27. Thus, it is possible to reduce the injection efficiency of the high frequency component of the white noise which is the dominant noise of the photo-voltaic element 21, and the S/N ratio can accordingly be improved.

The impedance conversion circuit 25 is not limited to the source follower and it is possible to use an emitter follower, for example. In addition, the frequency characteristic in the high frequency region may be intentionally deteriorated by determining the various constants when designing the lowpass filter 27. Furthermore, it is possible to combine the impedance conversion circuit 25 and the lowpass filter 27 in one by giving a lowpass filter characteristic to an operational amplifier.

As in the case of the embodiment of the construction shown in FIG. 7, the FET 22, the impedance conversion circuit 25, the signal processing circuit and the lowpass filter 27 may be formed on a single substrate.

The first and second embodiments use the MOS type FET for the FET 22, but it is of course possible to use a junction type FET.

Generally, an infrared detector has a plurality of photo-voltaic elements arranged in an array, and currents generated in parallel are supplied to a signal processing circuit (CCD) through corresponding MOS transistors. A signal multiplexing takes place in the signal processing circuit and a serial signal is obtained from the signal processing circuit. When forming a one-dimensional array of the conventional charge injection circuit shown in FIG. 1A, all of the photo-voltaic elements 1 arranged in the array make a common ohmic contact with the substrate.

On the other hand, when forming a one-dimensional array of the first embodiment of the charge injection circuit shown in FIG. 5A, the ohmic contact with the substrate must be made independently for each of the photo-voltaic elements 21 because the positive feedback is independently made to the substrate from each of the photo-voltaic elements 21. For this reason, it is necessary to electrically isolate the photo-voltaic elements 21 and connect the substrate of each photo-voltaic element 21 to the impedance conversion circuit 25. In this case, when the ohmic contact with the substrate is formed within the diffusion length of the minority carriers within a p-type layer from a pn junction interface of the photo-voltaic element 21, the surface recombination velocity becomes large and a dark current increases.

Next, a description will be given of embodiments of the charge injection circuit in which the increase of the dark current is suppressed.

FIGS. 13A and 13B are a cross sectional view and a plan view respectively showing a third embodiment of the charge injection circuit according to the present invention. In FIGS. 13A and 13B, those parts which are the same as those corresponding parts in FIG. 5A are designated by the same reference numerals, and a description thereof will be omitted. IR denotes the incoming infrared light.

In FIGS. 13A and 13B, a semiconductor substrate 56 made of HgCdTe, for example, is provided on an insulator body 55 made of CdTe, for example. The semiconductor substrate 56 is provided on the insulator body 55 with a sufficiently large light receiving area. A pn$^+$ junction of a p-type layer 56p and an n$^+$-type layer 56n is formed by an ion implantation, and an epitaxial layer or a bulk crystal film is used. A contact portion 57 makes contact with the n$^+$-type layer 56n of the semiconductor substrate 56 and is also connected to a node connecting one end of the impedance conversion circuit 25 and the source of the FET 22.

An ohmic contact portion 58 makes contact with the p-type layer 56p of the semiconductor substrate 56 and is also connected to the other end of the impedance conversion circuit 25. A protection layer 59 made of zinc sulfide (ZnS), for example, is formed on the semiconductor substrate 56. The photo-voltaic element 21 is constituted by the semiconductor substrate 56, the contact portions 57 and 58, and the protection layer 59.

The contact portion 58 is formed at a portion located the diffusion length or more of the minority carriers within the p-type layer 56p away from a pn$^+$ junction interface 56a of the semiconductor substrate 56. In FIG. 13A, L denotes a distance between the pn$^+$ junction interface 56a and the ohmic contact portion 58 which is the diffusion length or more away from the pn$^+$ junction interface 56a. By forming the ohmic contact portion 58 at the location shown, it is possible to eliminate the effects of the minority carriers generated in the ohmic contact portion 58 and accordingly reduce the dark current.

FIG. 14 shows the photo-voltaic element 21, the FET 22 and the impedance conversion circuit 25 arranged in an array. For convenience sake, only photo-voltaic elements 21$_1$ through 21$_3$, FETs 22$_1$ through 22$_3$, and impedance conversion circuits 25$_1$ through 25$_3$ are shown. The FETs 22$_1$ through 22$_3$, the impedance conversion circuits 25$_1$ through 25$_3$, and a CCD 60 are provided on a substrate 61 made of Si, for example. The photo-voltaic elements 21$_1$ through 21$_3$ are provided on the insulator body 55. The photo-voltaic elements 21$_1$ through 21$_3$ are electrically isolated by a process such as ion milling. The photo-voltaic elements 21$_1$ through 21$_3$ are connected to the FETs 22$_1$ through 22$_3$ and the impedance conversion circuits 25$_1$ through 25$_3$ by a wire bonding or the like. An output serial signal of the CCD 60 is obtained from a terminal 63 through an amplifier 62.

FIGS. 15A and 15B are a cross sectional view and a perspective view respectively showing a fourth embodiment of the charge injection circuit according to the present invention. In FIGS. 15A and 15B, those parts which are essentially the same as those corresponding parts in FIGS. 13A and 13B are designated by the same reference numerals, and a description thereof will be omitted.

In FIGS. 15A and 15B, a semiconductor substrate 65 has a p-type layer 65p and an n$^+$-type layer 65n, and the p-type layer 65p has a p$^+$-type layer 65pp which is doped to a p$^+$-type and has a high carrier density. The contact portion 57 makes contact with the n$^+$-type layer 65n, and the ohmic contact portion 58 makes contact with the p$^+$-type layer 65pp. In this case, the ohmic contact portion 58 is located at a portion within the diffusion length of the minority carriers within the p-type layer 65 away from the pn$^+$ junction interface 56a. The arrangement of the array becomes substantially the same as that shown in FIG. 14.

The p$^+$-type layer 65pp has an electrically reflecting state with respect to the minority carriers within the p-type layer 65p and suppresses the generation of the minority carriers. Thus, it is possible to prevent the increase of the dark current because the density of the minority carriers at the ohmic contact portion 58 is reduced to make the change in the distribution of the minority carriers within the semiconductor substrate 65 small. According to this embodiment, it is possible to reduce the dark current even through the ohmic contact portion 58 is located at a portion within the diffusion length of the minority carriers away from the pn$^+$ junction interface 56a.

FIGS. 16A and 16B are a cross sectional view and a perspective view respectively showing a fifth embodiment of the charge injection circuit according to the present invention. In FIGS. 16A and 16B, those parts which are essentially the same as those corresponding parts in FIGS. 13A and 13B are designated by the same reference numerals, and a description thereof will be omitted.

In FIGS. 16A and 16B, a semiconductor substrate 66 has a p-type layer 66p1, a p-type layer 66p2, and a n$^+$-type layer 66n. The p-type layer 66p1 is made of a semiconductor having a wide band gap, and the p-type layer 66p2 and the n$^+$-type layer 66n are made of a semiconductor having a narrow band gap thereby constituting a diode. The contact portion 57 makes contact with the n$^+$-type layer 66n, and the ohmic contact portion 58 makes contact with the p-type layer 66p1.

The structure shown in FIGS. 16A and 16B is obtained by forming the p-type layer 66p2 made of the narrow band gap semiconductor on the p-type layer 66p1 which is an epitaxial layer. Then, the n$^+$-type layer 66n is formed on the p-type layer 66p2, and the n$^+$pp junction is formed by a mesa etching. The arrangement of the array becomes substantially the same as that shown in FIG. 14.

According to this embodiment, the ohmic contact portion 58 is substantially located at a portion the diffusion length or more of the minority carriers away from the pn$^+$ junction interface, and it is thus possible to reduce the dark current.

Figure 17:
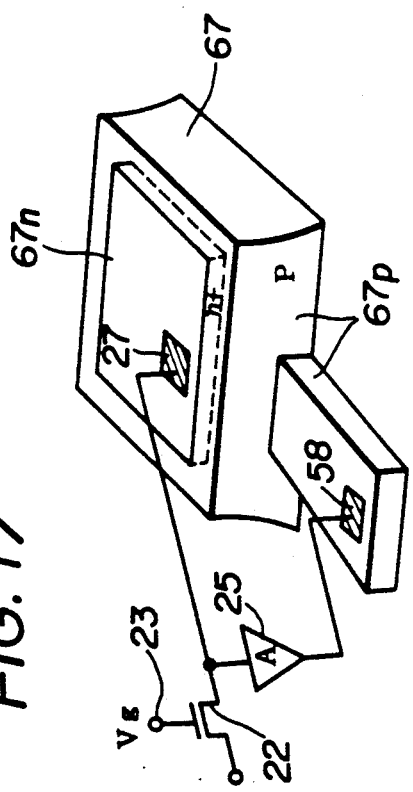
FIG. 17 is a perspective view showing a sixth embodiment of the charge injection circuit according to the present invention.

FIG. 17 is a perspective view showing a sixth embodiment of the charge injection circuit according to the present invention. In FIG. 17, those parts which are essentially the same as those corresponding parts in FIGS. 13A and 13B are designated by the same reference numerals, and a description thereof will be omitted.

In this embodiment, the diode portion has a planar structure. A semiconductor substrate 67 has a p-type layer 67p and an n+-type layer 67n, and a pn+ junction interface is exposed at the wafer. As in the case of the third embodiment shown in FIGS. 13A and 13B, the substrate ohmic contact portion 58 is located the diffusion length or more of the minority carriers within the p-type layer 67p from the pn+ junction interface of the semiconductor substrate 67. The effects obtainable in this embodiment are the same as those obtainable in the third through fifth embodiments described before.

When arranging the photo-voltaic elements in the array or matrix arrangement, the charge injection circuit must be provided for each photo-voltaic element. As a result, the structure of the infrared detector becomes extremely complex. Next, a description will be given on embodiments in which the structure of the infrared detector is simplified.

Figure 18:
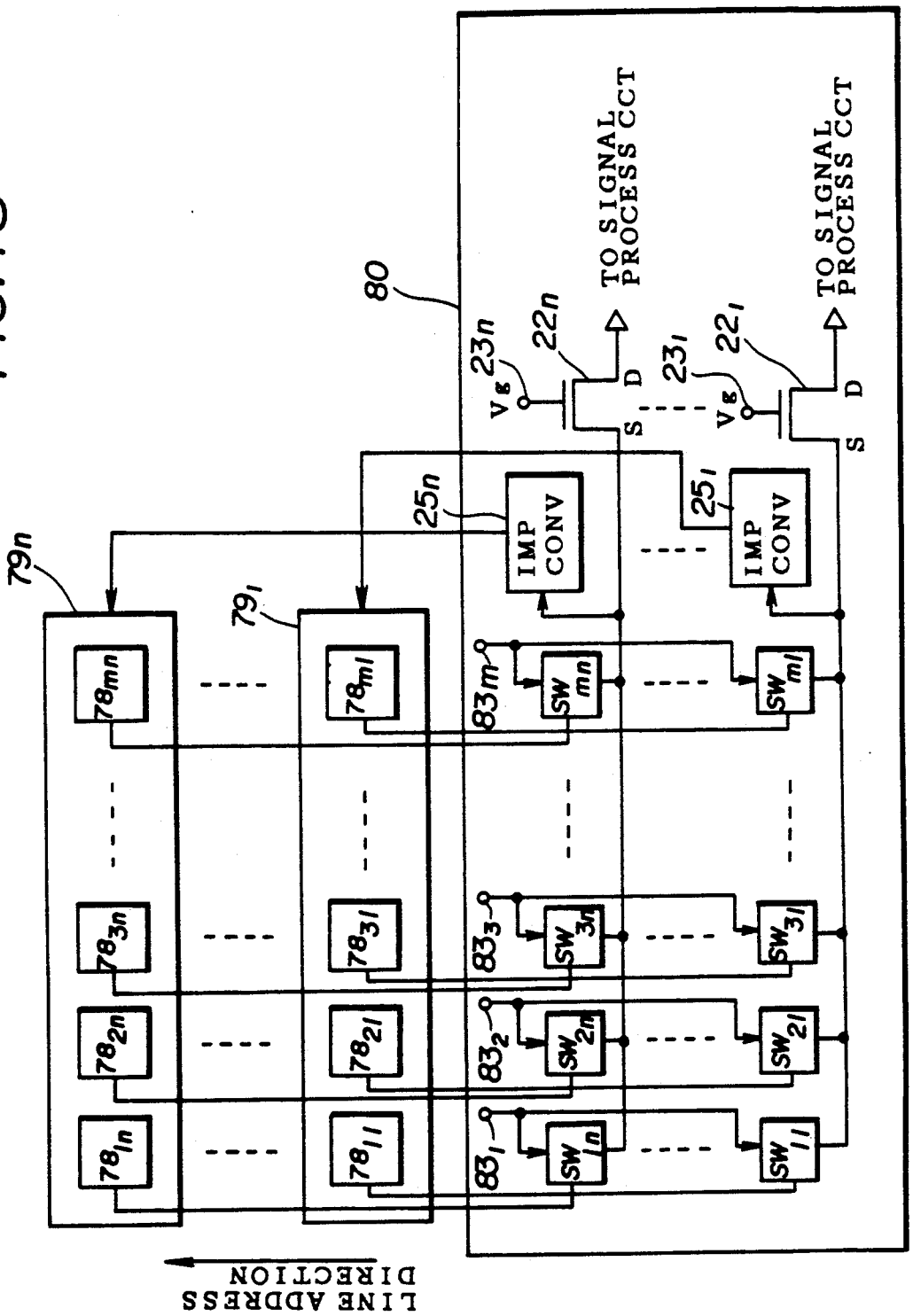
FIG. 18 is a block diagram for explaining the operating principle of a seventh embodiment of the charge injection circuit according to the present invention.

FIG. 18 is a block diagram for explaining the operating principle of a seventh embodiment of the charge injection circuit according to the present invention which is a scan type charge injection circuit. In FIG. 18, m×n photo-voltaic elements $78_{11}$ through $78_{mn}$ are arranged in an array or matrix arrangement. There are n photo-voltaic elements arranged in a line direction, that is, a line address direction, and there are m photo-voltaic elements arranged in a direction perpendicular to the line address direction. The m photo-voltaic elements $78_{1j}$ through $78_{mj}$ are provided on a detector element substrate $79_j$, where j=1, ..., n. A substrate 80 is provided independently of the detector element substrates $79_1$ through $79_n$. MOS type FETs $22_1$ through $22_n$ which constitute input gates provided for each column perpendicular to the line address direction, impedance circuits $25_1$ through $25_n$, address switches $SW_{11}$ through $SW_{mn}$ provided in 1:1 correspondence with the photo-voltaic elements $78_{11}$ through $78_{mn}$, and signal processing circuits (not shown) are provided on the substrate 80. Terminals $23_1$ through $23_n$ are connected to the corresponding gates of the FETs $22_1$ through $22_n$.

The n photo-voltaic elements arranged in the line address direction (for example, the n photo-voltaic elements $78_{11}$ through $78_{1n}$) are arranged on mutually different detector element substrates $79_1$ through $79_n$ because the m photo-voltaic elements $78_{1j}$ through $78_{mj}$ are provided on a detector element substrate $79_j$ as described before, where j=1, ..., n.

The m photo-voltaic elements $78_{1j}$ through $78_{mj}$ provided on the detector element substrate $79_j$ are coupled in common to a source of the FET $22_j$ through the respective address switches $SW_{11}$ through $SW_{mn}$. On the other hand, the source of the FET $22_j$ is coupled to the detector element substrate $79_j$ through the corresponding impedance conversion circuit $25_j$.

Out of the address switches $SW_{11}$ through $SW_{mn}$, the n address switches $SW_{11}$ through $SW_{1n}$, the n address switches $SW_{21}$ through $SW_{2n}$, the n address switches $SW_{31}$ through $SW_{3n}$, ..., and the n address switches $SW_{m1}$ through $SW_{mn}$ are controlled responsive to switching signals applied to terminals $83_1$ through $83_m$ so that the address switches of the same line address are simultaneously turned ON and the address switches are sequentially turned ON in the sequence of the line address.

On the other hand, based on gate voltages applied to the terminals $23_1$ through $23_n$, the FETs $22_1$ through $22_n$ are sequentially turned ON within the time in which the n address switches of the same line address are simultaneously turned ON.

For example, the m photo-voltaic elements $78_{11}$ through $78_{m1}$ are respectively connected to the m address switches $SW_{11}$ through $SW_{m1}$. However, the address switches $SW_{11}$ through $SW_{m1}$ are sequentially turned ON based on the switching signals from the terminals $83_1$ through $83_m$ and it is impossible that two or more address switches are turned ON simultaneously. As a result, the photocurrent (charge) from only one of the photo-voltaic elements $78_{11}$ through $78_{m1}$ is obtained through a corresponding one of the address switches $SW_{11}$ through $SW_{m1}$ which is turned ON and is supplied to the source of the FET $22_1$.

Accordingly, the source potential of the FET $22_1$ is only due to the photocurrent from one of the m photo-voltaic elements $78_{11}$ through $78_{m1}$ provided on the common detector element substrate $79_1$, and the photocurrents from two or more photo-voltaic elements will not be mixed. For this reason, it is possible to accurately inject the charge from one photo-voltaic element, and the injection efficiency is improved as in the case of the first embodiment described before in conjunction with FIGS. 5A and 5B by making a positive feedback to the detector element substrate $79_1$ through the impedance conversion circuit $25_1$.

Thus, the injection of the charge from one photo-voltaic element and the positive feedback to the detector element substrate are carried out for every m photo-voltaic elements and m address switches arranged perpendicularly to the line address direction by using in common the FETs $22_1$ through $22_n$, the impedance conversion circuits $25_1$ through $25_n$ and the detector element substrates $79_1$ through $79_n$.

Figure 19:
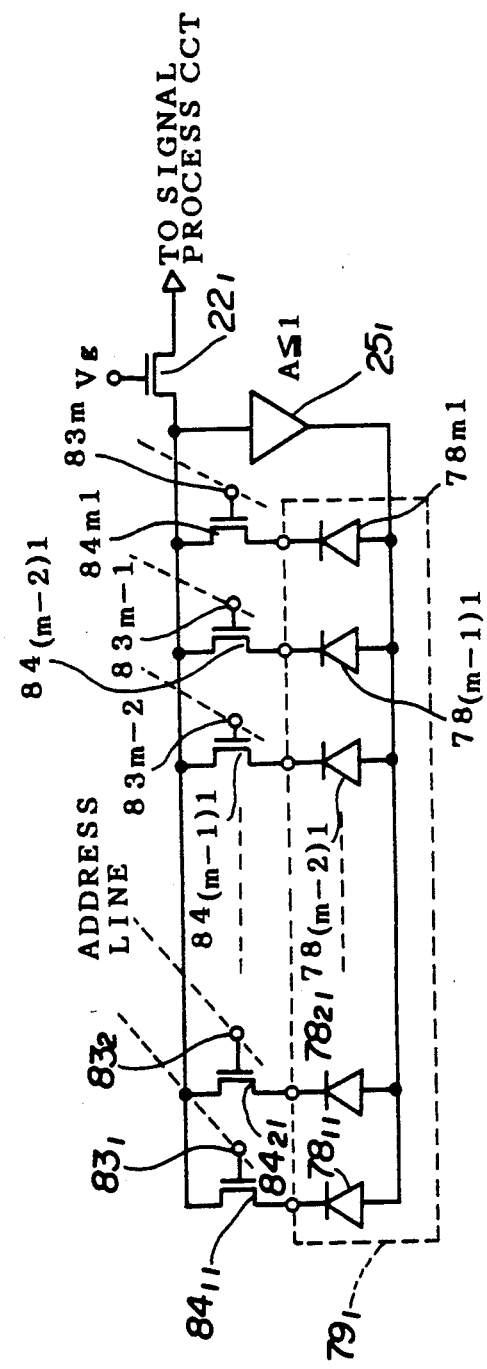
FIG. 19 is a circuit diagram showing an embodiment of an essential part of the seventh embodiment shown in FIG. 18.

FIG. 19 shows an embodiment of an essential part of the seventh embodiment shown in FIG. 18. In FIG. 19, those parts which are the same as those corresponding parts in FIG. 18 are designated by the same reference numerals, and a description thereof will be omitted. In FIG. 19, the circuit construction is only shown for one column perpendicular to the line address direction.

The cathodes of the photo-voltaic elements $78_{11}$ through $78_{m1}$ are respectively coupled to the input side of the impedance conversion circuit $25_1$ through sources and drains of MOS type FETs $84_{11}$ through $84_{m1}$ which respectively correspond to the address switches $SW_{11}$ through $SW_{m1}$. The impedance conversion circuit $25_1$ is a buffer amplifier (non-inverting amplifier) having the gain A which is greater than zero and less than or equal to one. For example, the impedance conversion circuit $25_1$ is made up of a source follower, an emitter follower, or a voltage follower using an operational amplifier. The output side of the impedance conversion circuit $25_1$ is connected to the detector element substrate $79_1$.

Hence, out of the FETs $84_{11}$ through $84_{m1}$, one FET which is ON receives the photocurrent from one selected photo-voltaic element connected thereto, and the received photocurrent is passed through the source and drain of the FET which is ON and supplied to the source of the FET $22_1$ which constitutes the input gate. As a result, the source potential of the FET $22_1$ is positively fed back to the anodes of the m photo-voltaic elements $78_{11}$ through $78_{m1}$ including the one selected photo-voltaic element through the impedance conversion circuit $25_1$. Accordingly, the injection efficiency of the charge injection circuit is improved.

Figure 20:
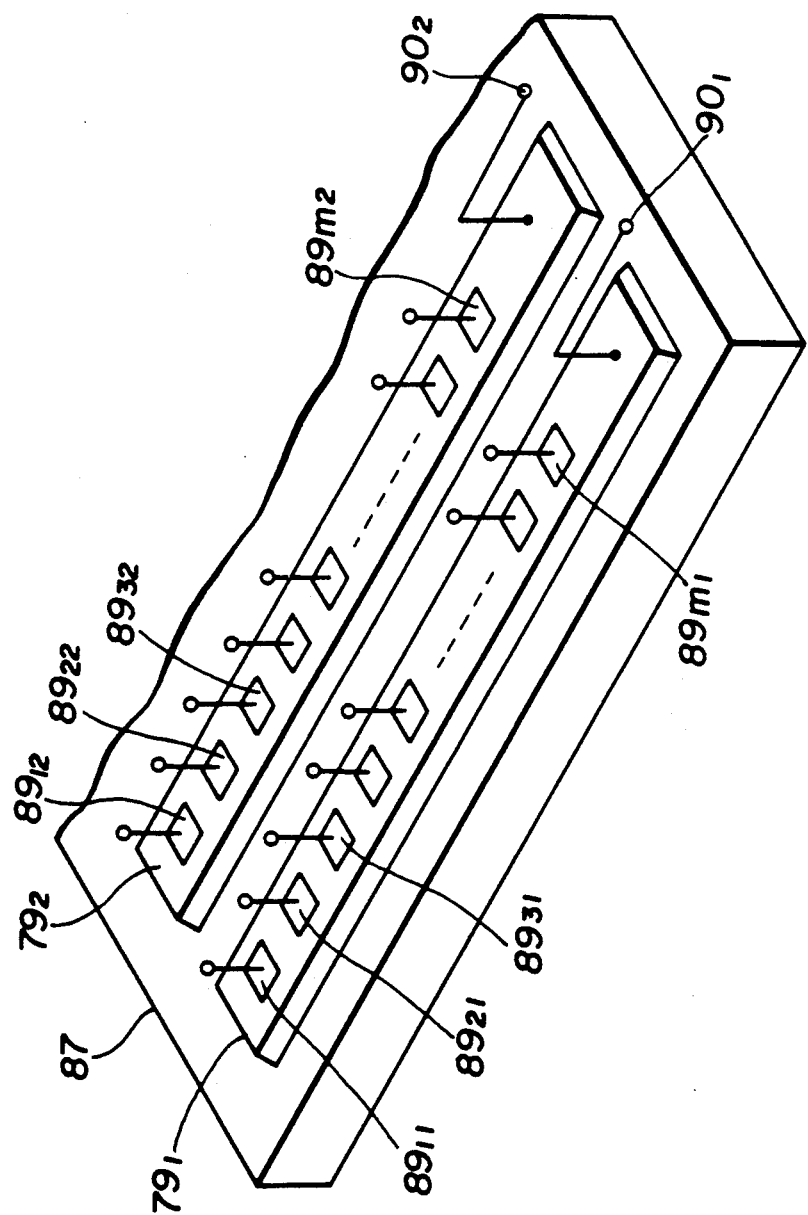
FIG. 20 is a perspective view showing an embodiment of the construction of an essential part of the seventh embodiment shown in FIG. 18.

FIG. 20 shows an embodiment of the construction of an essential part of the seventh embodiment shown in FIG. 18. FIG. 20 shows the construction of the detector element substrates $79_1$ and $79_2$, and the illustration of the other detector element substrates $79_3$ through $79_n$ and the substrate 80 is omitted. An insulator substrate 87 is made of sapphire, gallium arsenide (GaAs), cadmium telluride (CdTe) or the like. A semiconductor film made of InSb, HgCdTe or the like is formed on the insulator substrate 87 and patterned into bands to isolate the columns to form the detector element substrates $79_1$ and $79_2$.

Photodiodes $89_{11}$ through $89_{m1}$ which correspond to the photo-voltaic elements $78_{11}$ through $78_{m1}$ are formed on the detector element substrate $79_1$. Similarly, photodiodes $89_{12}$ through $89_{m2}$ which correspond to the photo-voltaic elements $78_{12}$ through $78_{m2}$ are formed on the detector element substrate $79_2$. Input terminals $90_1$ and $90_2$ respectively receive the signals from the impedance conversion circuits $25_1$ and $25_2$, and the source potentials of the FETs $22_1$ and $22_2$ are positively fed back.

Figure 21:
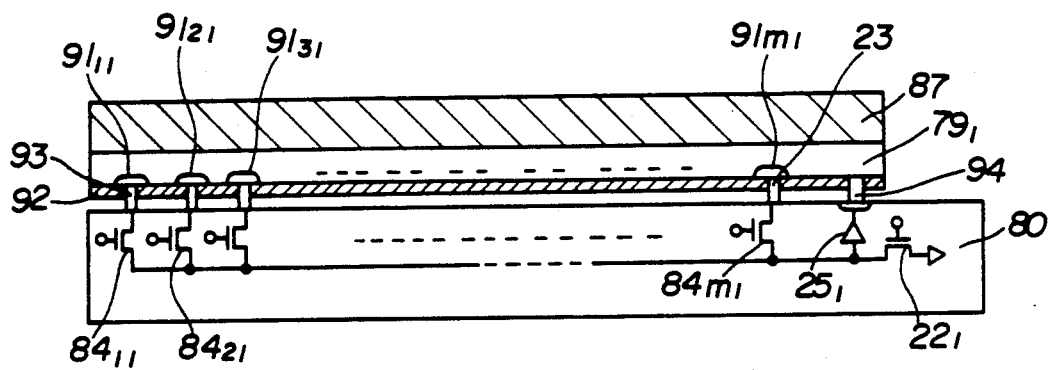
FIG. 21 is a side view showing an embodiment of the construction of another essential part of the seventh embodiment shown in FIG. 18.

FIG. 21 shows an embodiment of the construction of another essential part of the seventh embodiment shown in FIG. 18. FIG. 21 shows the detector element substrate $79_1$ shown in FIG. 20 in a side view together with the substrate 80. The detector element substrate $79_1$ is a p-type substrate made of InSb, HgCdTe or the like, and $n^+$-type regions $91_{11}$ through $91_{m1}$ are formed in the detector element substrate $79_1$ to constitute the photodiodes $89_{11}$ through $89_{m1}$ which respectively correspond to the photo-voltaic elements $78_{11}$ through $78_{m1}$.

A thin film 92 made of $SiO_2$, ZnS or the like is formed on the detector element substrate $79_1$ and contact holes are formed in the thin film 92. Bump electrodes 93 made of indium (In) or the like are formed in the contact holes and connect the $n^+$-type regions $91_{11}$ through $91_{m1}$ to the sources of the corresponding FETs $84_{11}$ through $84_{m1}$ formed on the substrate 80. In addition, the output terminal of the impedance conversion circuit $25_1$ provided on the substrate 80 is connected to the detector element substrate $79_1$ through a bump electrode 94. The infrared light is irradiated downwardly in FIG. 21 onto the back surface of the insulator substrate 87 to generate the minority carriers.

In FIG. 21, only the FETs $84_{11}$ through $84_{m1}$, the impedance conversion circuit $25_1$ and the FET $22_1$ amounting to one column are shown on the substrate 80. However, there actually are n columns of such circuits provided in parallel.

Figure 22:
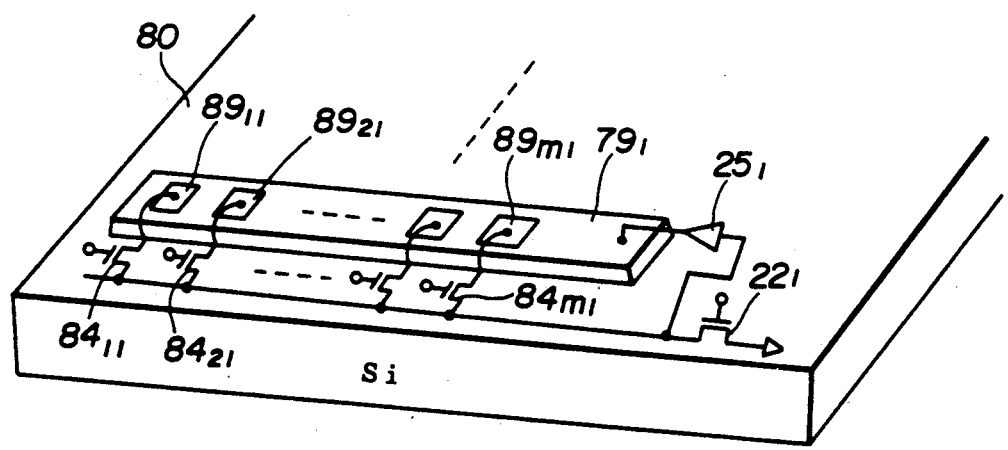
FIG. 22 is a perspective view showing another embodiment of the construction of an essential part of the seventh embodiment shown in FIG. 18.

The method of isolating the detector element substrates is not limited to the patterning of the semiconductor film on the insulator substrate 87 in bands as described before, and it is also possible to employ other methods as will be described hereunder. FIG. 22 shows another embodiment of the construction of an essential part of the seventh embodiment shown in FIG. 18. In FIG. 22, those parts which are essentially the same as those corresponding parts in FIG. 20 are designated by the same reference numerals, and a description thereof will be omitted.

In FIG. 22, the circuits such as the FETs $22_1$ and $84_{11}$ through $84_{m1}$, and the impedance conversion circuit $25_1$ are provided on the substrate 80 which is made of Si, for example, and such circuits amounting to n columns are provided on the substrate 80. The detector element substrates $79_1$ through $79_n$ (only $79_1$ shown in FIG. 22) are adhered on the substrate 80 to constitute the scanning type charge injection circuit. An infrared detecting material such as InSb and HgCdTe is used for the detector element substrates $79_1$ through $79_n$. The photodiodes $89_{11}$ through $89_{m1}$ may be formed before or after the detector element substrate $79_1$ is adhered on the substrate 80. In this embodiment, the infrared light is irradiated downwardly in FIG. 22 from above the detector element substrate $79_1$ and the like.

Figure 23A:
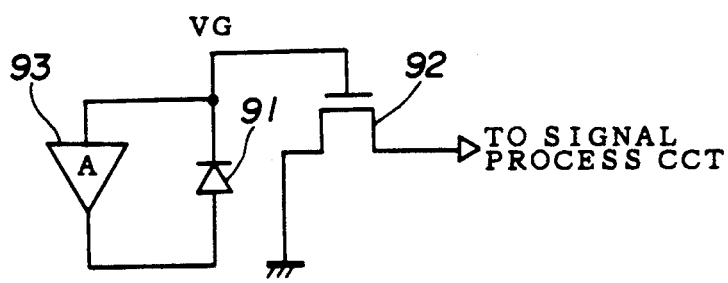
FIG. 23A is a circuit diagram showing an eighth embodiment of the charge injection circuit according to the present invention.
Figure 23B:
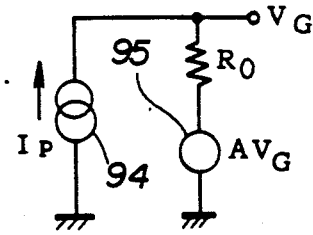
FIG. 23B is an A.C. equivalent circuit diagram of the charge injection circuit shown in FIG. 23A.

FIG. 23A is a circuit diagram showing an eighth embodiment of the charge injection circuit according to the present invention, and FIG. 23B is an A.C. equivalent circuit diagram of the charge injection circuit shown in FIG. 23A excluding the FET. In this embodiment, a potential at a node connecting a photo-voltaic element 91 and a gate of a FET 92 is positively fed back to a substrate potential of the photo-voltaic element 91 through an impedance conversion circuit 93 having a gain A which is greater than zero and less than or equal to one.

In FIG. 23B, a current source 94 generates a photocurrent $I_P$ when the photo-voltaic element 91 receives an infrared light. The photocurrent $I_P$ is dependent on a quantity of the received infrared light. A voltage source 95 corresponds to a voltage $AV_G$ which is obtained by a positive feedback of a potential $V_G$ at the node connecting the photo-voltaic element 91 and the gate of the FET 92 to the substrate potential of the photo-voltaic element 91 through the impedance conversion circuit 93, where A is greater than zero and less than or equal to one.

The internal resistance $R_0$ of the photo-voltaic element 91 is connected in series with the voltage source 95. A node connecting the internal resistance $R_0$ and the current source 94 is connected to the gate of the FET 92. In FIG. 23B, no current flows to the gate of the FET 92, and the photocurrent $I_P$ flows through the series circuit of the internal resistance $R_0$ and the voltage source 94 without being divided. Accordingly, the gate voltage (open voltage) $V_G$ can be described by the following formula (11).

$$V_G = (I_P \cdot R_0)/(1-A) \tag{11}$$

The open voltage $V_G$ is $1/(1-A)$ times the open voltage $I_P R_0$ of the conventional charge injection circuit described before in conjunction with FIGS. 3A and 3B. Since the gain A is greater than zero and less than or equal to one, it may be seen that the open voltage $V_G$ is amplified by $1/(1-A)$.

Figure 24:
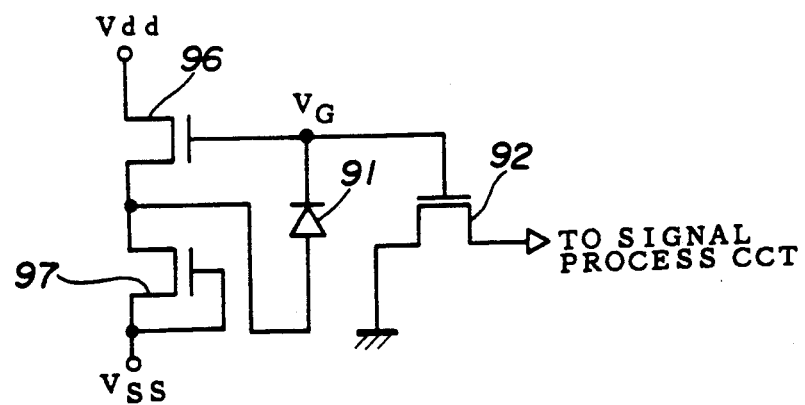
FIG. 24 is a circuit diagram showing an embodiment of the circuit construction of the eighth embodiment shown in FIG. 23A.

FIG. 24 is a circuit diagram showing an embodiment of the circuit construction of the eighth embodiment shown in FIG. 23A. In FIG. 24, those parts which are the same as those corresponding parts in FIG. 23A are designated by the same reference numerals, and a description thereof will be omitted.

In FIG. 24, a gate of a MOS type FET 96 is connected to the node connecting the photo-voltaic element 91 and the gate of the FET 92. A source of the FET 96 is connected to the anode (substrate) of the photo-voltaic element 91 and a drain of a MOS type FET 97. The FET 97 acts as a load on the FET 96 and the gate and a source of the FET 97 are connected to each other. The FETs 96 and 97 constitute a source follower corresponding to the impedance conversion circuit 93. Vdd and Vss denote respective power source voltages to the drain of the FET 96 and the source of the FET 97.

Figure 25:
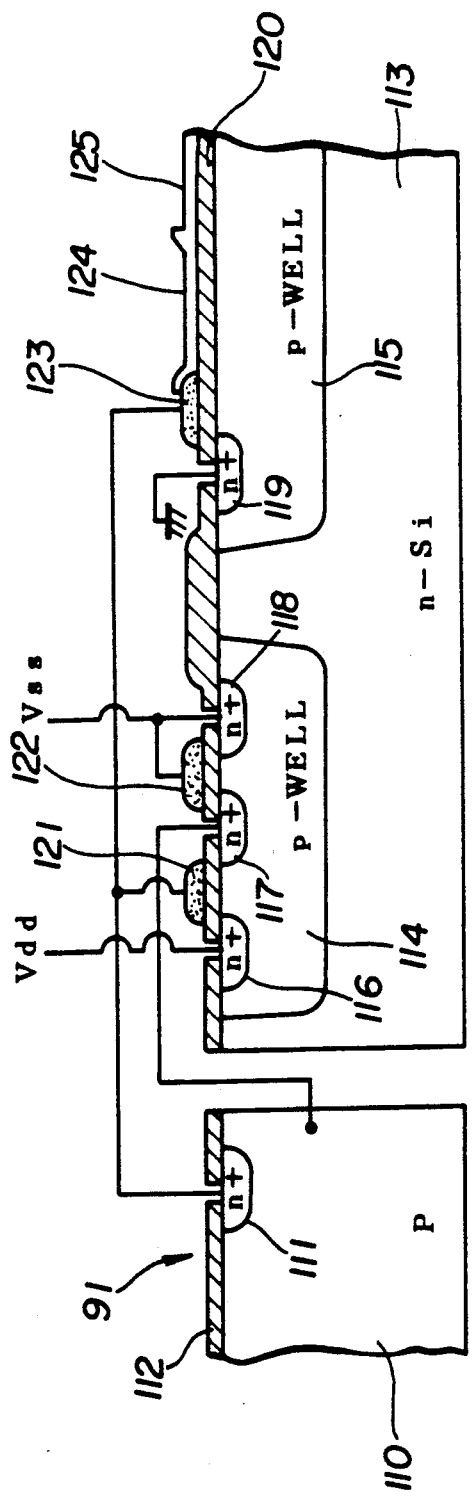
FIG. 25 is a cross sectional view showing the construction of an essential part of the circuit shown in FIG. 24.

FIG. 25 is a cross sectional view showing the construction of an essential part of the circuit shown in FIG. 24. The photo-voltaic element 91 has a p-type substrate 110, and n+-type diffusion layer 111 formed in the p-type substrate 110, and an insulator layer 112 formed on the p-type substrate 110. The p-type substrate 110 is made of InSb, PbSnTe, HgCdTe or the like. In addition, the insulator layer 112 is made of $SiO_2$, ZnS or the like.

On the other hand, two p-type wells 114 and 115 are formed in an n-type Si substrate 113, and n+-type diffusion layers 116, 117 and 118 are formed within the p-type well 114. In addition, an n+-type diffusion layer 119 is formed within the other p-type well 115. The n+-type diffusion layer 119 constitutes a source region of the FET 92 and also constitutes the input diode together with the p-type well 115.

An oxide layer 120 made of $SiO_2$, for example, is formed by a known means on the n-type Si substrate 113 which is already formed with the regions described above. In addition, gate electrodes 121 and 122 made of polysilicon and the like, an input gate electrode 123, a storage gate 124, an electrode 125 which constitutes a part of the signal processing circuit (CCD) are thereafter formed on the n-type Si substrate 113.

The drain of the FET 92 corresponds to the region of the p-type well 115 immediately below the storage gate 124, and the gate of the FET 92 corresponds to the input gate electrode 123. In addition, the drain of the FET 96 corresponds to the n+ diffusion layer 116. Because the source of the FET 96 and the drain of the FET 97 always have the same potential, the n+-type diffusion layer 117 is used in common as the source of the FET 96 and the drain of the FET 97. The source of the FET 97 corresponds to the n+-type diffusion layer 118.

The open voltage $V_G$ determined by a product of the photocurrent generated when the photo-voltaic element 91 receives the infrared light and the internal resistance $R_0$ of the photo-voltaic element 91 is supplied from the n+-type diffusion layer 111 to the gate electrode 121 which corresponds to the gate of the FET 96. The open voltage $V_G$ is subject to the impedance conversion in the FET 96 which is made up of the gate electrode 121, the oxide layer 120, the n+-type diffusion layers 116 and 117, the p-type well 114, and the Si substrate 113. Then, the open voltage $V_G$ subject to the impedance conversion is positively fed back to the substrate 110 through the n+-type diffusion layer 117.

The open voltage $V_G$ which is amplified in this manner is applied to the gate electrode 123 through the n+-type diffusion layer 111, and then passes through the region of the p-type well 115 immediately below the input gate electrode 123 to store a signal charge in the potential well of the region of the p-type well 115 immediately below the storage gate 124.

The gain A of the source follower constituted by the FETs 96 and 97 can easily be set in the range of 0.9. Hence, according to this embodiment, it may be seen from the formula (11) that the open voltage $V_G$ can be improved to approximately ten times that obtained in the conventional charge injection circuit described before in conjunction with FIGS. 3A and 3B. As a result, the drain current of the FET 92 becomes large and the signal quantity becomes large while the noise is approximately constant, thereby making it possible to considerably improve the S/N ratio.

By making the current which flows through the FET 97 larger than the photocurrent $I_P$ by one digit, the operating point remains unchanged as in the case of the conventional charge injection circuit not having the FET 96. For this reason, no problems will occur as in the case where an amplifier is connected to the gate of the FET 92, and furthermore, the power consumption does not become a problem because the power consumption of the FETs 96 and 97 is small.

As in the case of the embodiments described before, the impedance conversion circuit 93 is not limited to the source follower, and other circuits having a gain close to one may be used. Examples of such circuits are the emitter follower having a greater current driving capability than the source follower, and the operational amplifier.

The FET 92, the impedance conversion circuit 93 and the signal processing circuit (not shown) may be provided on the same substrate (not shown). In addition, the FET 92 is not limited to the MOS type FET, and a junction type FET, for example, may be used for the FET 92.

Figure 26A:
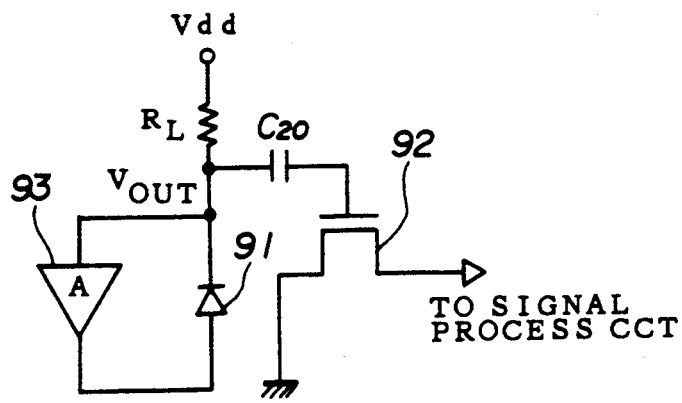
FIG. 26A is a circuit diagram showing a ninth embodiment of the charge injection circuit according to the present invention.
Figure 26B:
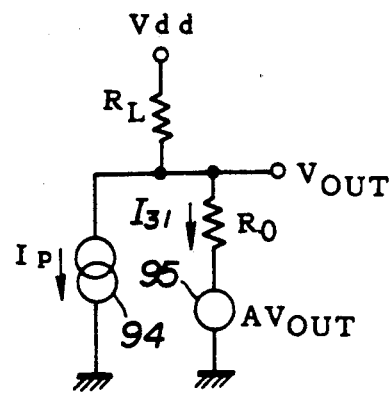
FIG. 26B is an A.C. equivalent circuit diagram of the charge injection circuit shown in FIG. 26A.

FIG. 26A is a circuit diagram showing a ninth embodiment of the charge injection circuit according to the present invention, and FIG. 26B is an A.C. equivalent circuit diagram of the input circuit portion of the charge injection circuit shown in FIG. 26A. In FIGS. 26A and 26B, those parts which are essentially the same as those corresponding parts in FIGS. 23A and 23B are designated by the same reference numerals, and a description thereof will be omitted.

In this embodiment, the output voltage $V_{OUT}$ of the photo-voltaic element 91 which is biased through a load resistance $R_L$ is positively fed back to the substrate potential of the photo-voltaic element 91 through the impedance conversion circuit 93 having the gain A which is less than or equal to one, as shown in FIG. 26A. Moreover, a capacitor $C_{20}$ is connected between the gate of the FET 92 and a node connecting the photo-voltaic element 91, the impedance conversion circuit 93 and the load resistance $R_L$.

In FIG. 26B, the voltage source 95 corresponds to the voltage $AV_{OUT}$ which is obtained by a positive feedback of the output voltage $V_{OUT}$ to the substrate potential of the photo-voltaic element 91 through the impedance conversion circuit 93, where A is less than or equal to one.

The voltage source 95 is coupled to the input terminal of the power source voltage Vdd through the internal resistance $R_0$ of the photo-voltaic element 91 and the load resistance $R_L$ which are connected in series. A series circuit of the voltage source 95 and the internal resistance $R_0$ is connected in parallel to the current source 94.

The following formulas (12) and (13) stand when a current flowing through the internal resistance $R_0$ is denoted by $I_{31}$.

$$Vdd = R_L(I_{31} + I_P) + I_{31} \cdot R_0 + A \cdot V_{OUT} \tag{12}$$

$$V_{OUT} = I_{31} \cdot R_0 + A \cdot V_{OUT} \tag{13}$$

When the formulas (12) and (13) are solved for $V_{OUT}$ by eliminating $I_{31}$, the following formula (14) can be obtained.

$$V_{OUT} = (V_{dd} - R_L \cdot I_P)/[1 + (1-A) \cdot (R_L/R_0)] \quad (14)$$

When the formula (14) is compared with the formula (4) described before, it may be seen that in this embodiment the internal resistance $R_0$ is in effect $1/(1-A)$ times that of the conventional charge injection circuit.

Because the gain A of the impedance conversion circuit 93 is greater than zero and less than or equal to one, the internal resistance $R_0$ is in effect multiplied by $1/(1-A)$, and it is possible to make the voltage supplied to the gate of the FET 92 large even when the value of the load resistance $R_L$ is large.

Figure 27:
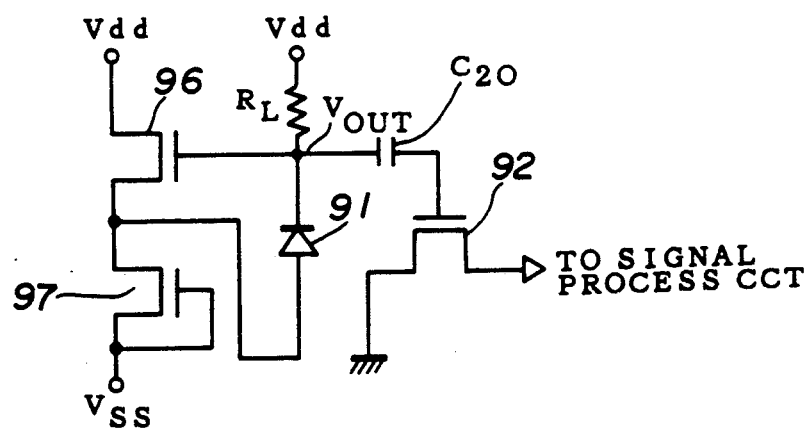
FIG. 27 is a circuit diagram showing an embodiment of the circuit construction of the ninth embodiment shown in FIG. 26A.

FIG. 27 is a circuit diagram showing an embodiment of the circuit construction of the ninth embodiment shown in FIG. 26A. In FIG. 27, those parts which are the same as those corresponding parts in FIGS. 24 and 26A are designated by the same reference numerals, and a description thereof will be omitted.

In FIG. 27, the gate of a MOS type FET 96 is connected to the node connecting the photo-voltaic element 91, the load resistance $R_L$ and the capacitor $C_{20}$. The source of the FET 96 is connected to the anode (substrate) of the photo-voltaic element 91 and the drain of the FET 97.

Figure 28:
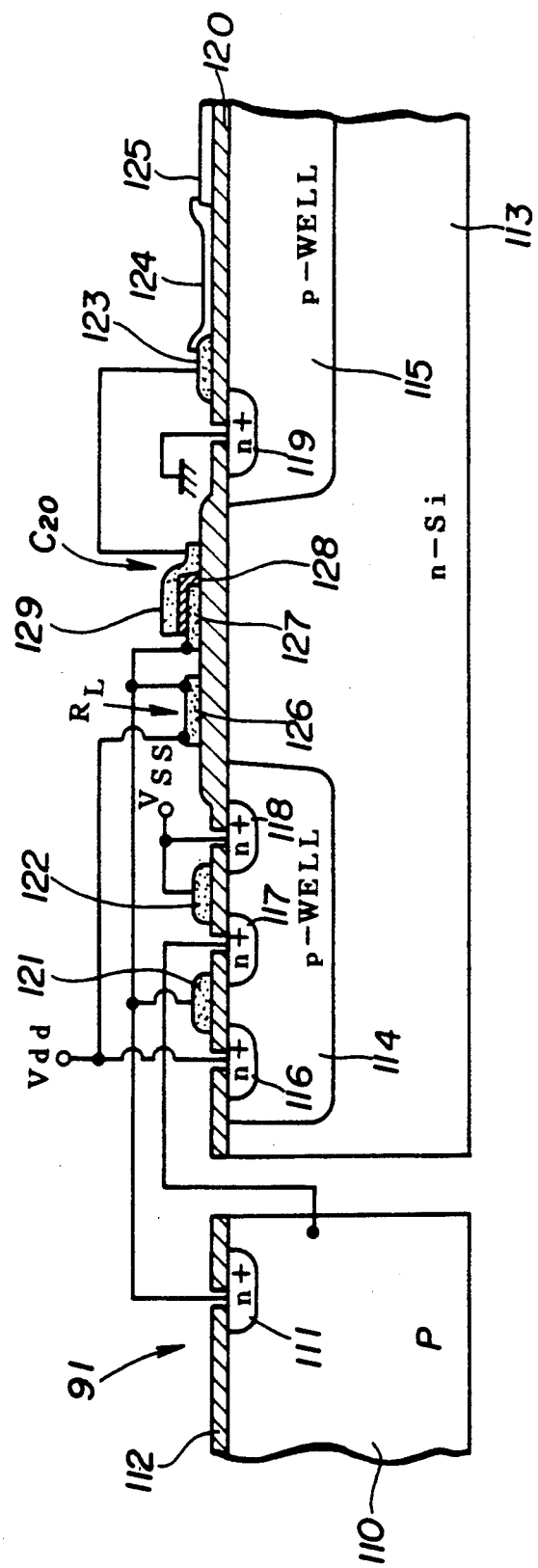
FIG. 28 is a cross sectional view showing the construction of an essential part of the circuit shown in FIG. 27.

FIG. 28 is a cross sectional view showing the construction of an essential part of the circuit shown in FIG. 27. In FIG. 28, those parts which are essentially the same as those corresponding parts in FIG. 25 are designated by the same reference numerals, and a description thereof will be omitted.

A non-doped polysilicon layer 126 is formed on the oxide layer 120 to constitute the load resistance $R_L$. At another position on the oxide layer 120, a polysilicon layer 127, an oxide layer 128 made of $SiO_2$ or the like and a polysilicon layer 129 are sequentially stacked to constitute the capacitor $C_{20}$.

The output voltage $V_{OUT}$ determined by the photocurrent generated when the photo-voltaic element 91 receives the infrared light and the internal resistance $R_0$ of the photo-voltaic element 91 is supplied from the n+-type diffusion layer 111 to the gate electrode 121 which corresponds to the gate of the FET 96. The output voltage $V_{OUT}$ is subject to the impedance conversion in the FET 96 which is made up of the gate electrode 121, the oxide layer 120, the n+-type diffusion layers 116 and 117, the p-type well 114, and the Si substrate 113. Then, the output voltage $V_{OUT}$ subject to the impedance conversion is positively fed back to the substrate 110 through the n+-type diffusion layer 117.

The output voltage $V_{OUT}$ which is amplified in this manner and described by the formula (14) is obtained from the n+-type diffusion layer 111. The obtained output voltage $V_{OUT}$ is applied to the gate electrode 123 through the capacitor $C_{20}$ which passes only the A.C. component, and is then passed through the region of the p-type well 115 immediately below the input gate electrode 123 to store a signal charge in the potential well of the region of the p-type well 115 immediately below the storage gate 124.

The gain A of the source follower constituted by the FETs 96 and 97 can easily be set in the range of 0.9. Hence, according to this embodiment, it may be seen from the formula (14) that the output voltage $V_{OUT}$ can be improved to approximately ten times that obtained in the conventional charge injection circuit described before. As a result, the drain current of the FET 92 becomes large and the signal quantity becomes large while the noise is approximately constant, thereby making it possible to considerably improve the S/N ratio.

In the case where $A = 1$, the output voltage $V_{OUT}$ becomes $V_{dd} - R_L \cdot I_P$ as may be seen from the formula (14). Hence, it is possible to make the varying range of the output voltage $V_{OUT}$ large by setting the value of the load resistance $R_L$ to a large value.

As in the case of the embodiments described before, the impedance conversion circuit 93 is not limited to the source follower, and other circuits having a gain close to one may be used. In addition, the load resistance $R_L$ may be formed by changing the width-to-length ratio of a MOS type FET instead of using the polysilicon layer 126. In addition, the FET 92 is not limited to the MOS type FET, and a junction type FET, for example, may be used for the FET 92.

In the conventional charge injection circuit described before in conjuction with FIG. 4, the gain −B of the negative feedback amplifier 5 can be set to approximately 10 when the stable operation and power consumption are considered. Thus, the injection efficiency is only in the order of ten times that of the conventional charge injection circuit not having the negative feedback.

On the other hand, in the first embodiment shown in FIG. 5A, for example, the impedance conversion circuit 25 is constituted by a source follower and the gain A thereof is approximately 0.9. Hence, the injection efficiency is only in the order of ten times that of the conventional charge injection circuit not having the negative feedback or the impedance conversion circuit.

In order to further improve the injection efficiency, it is necessary to use high-grade circuits such as an operational amplifier. But this will make it difficult to form the charge injection circuit in the form of an integrated circuit.

Figure 29:
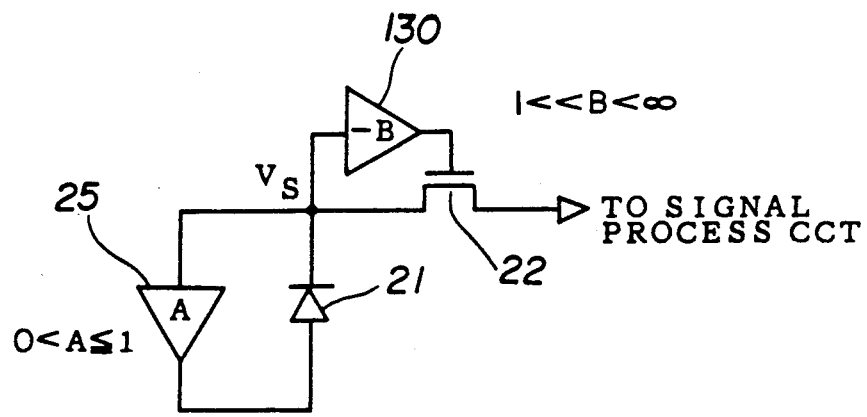
FIG. 29 is a circuit diagram showing a tenth embodiment of the charge injection circuit according to the present invention.

Next, a description will be given on an embodiment in which the injection efficiency is greatly improved by use of a simple circuit. FIG. 29 shows a tenth embodiment of the charge injection circuit according to the present invention. In FIG. 29, those parts which are essentially the same as those corresponding parts in FIG. 5A are designated by the same reference numerals, and a description thereof will be omitted. In this embodiment, a negative feedback amplifier 130 having a gain −B is provided between the cathode of the photo-voltaic element 21 and the gate of the FET 22. Hence, the source potential of the FET 22 is positively fed back to the anode (substrate impedance conversion circuit 25 having the gain A which is greater than zero and less than or equal to one, while the source potential of the FET 22 is also negatively fed back to the gate of the FET 22 through the negative feedback amplifier 130 which has the gain −B.

Figure 30:
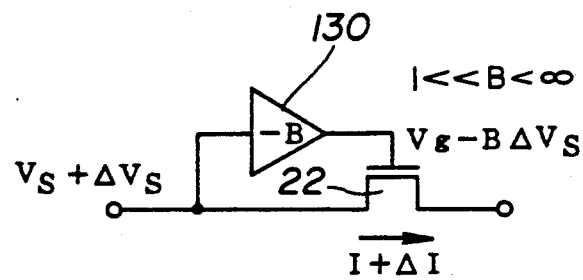
FIG. 30 is a circuit diagram showing a gate feedback portion of the charge injection circuit shown in FIG. 29.

FIG. 30 shows only the gate feedback portion of the charge injection circuit shown in FIG. 29. In this case, a current I which flows through the FET 22 in the weak inversion state, that is, the operating region under the normal operating condition, can be described by the following formula (15), where Vg denotes the gate voltage of the FET 22, $V_S$ denotes the source voltage of the FET 22, $I_{ds}$ denotes the drain- to -source current of the FET 22 when $V_g - V_S = 0$, q denotes the electron charge, k denotes the Boltzmann constant, T denotes the absolute temperature, and n is a constant determined by the configuration or parameters of the device.

$$I = I_{ds} \exp[q(V_g - V_S)/nkT] \quad (15)$$

When the source voltage becomes $V_S + \Delta V_S$ and a voltage $(V_g - B \cdot \Delta V_S)$ is applied to the gate of the FET 22, a current $I + \Delta I$ which flows through the FET 22 can be described by the following formula (16).

$$I + \Delta I = I_{ds} \exp[q(V_g - V_S)/nkT - q(1+B)\Delta V_S/nkT] \quad (16)$$

Accordingly, the following formula (17) can be obtained.

$$\Delta I_{ds} \exp[q(V_g - V_S)/nkT] \cdot [\exp(-q(1+B)\Delta V_S/nkT) - 1] \quad (17)$$

In addition, the following formula (18) and $e_x \approx 1 + x$ stand.

$$\partial I/\partial V_S = (-q \cdot I_{ds}/nkT) \cdot \exp[q(V_g - V_S)/nkT] = gm \quad (18)$$

Therefore, a current deviation $\Delta I$ due to minute voltage $\Delta V_S$ can be described by the following formula (19) by using the formula (17).

$$\Delta I = -gm \cdot q(1+B)/nkT \cdot \Delta V_S \cdot (-nkT/q) \quad (19)$$

Thus, the following formula (20) stands.

$$\Delta I/\Delta V_S = gm' = (1+B) \cdot gm \quad (20)$$

Accordingly, it may be seen that the mutual conductance gm becomes $(1+B)$ times in the weak inversion state by the negative feedback to the gate of the FET 22.

Figure 31:
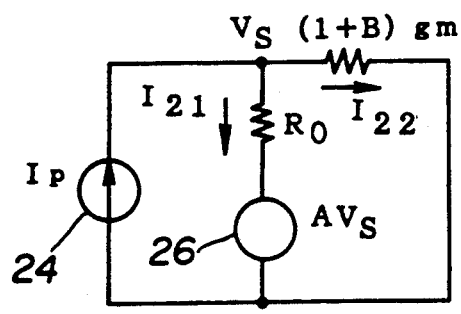
FIG. 31 is an A.C. equivalent circuit diagram of the charge injection circuit shown in FIG. 29.

When the formula (20) is used to illustrate the A.C. equivalent circuit of the charge injection circuit shown in FIG. 29, it becomes as shown in FIG. 31. In FIG. 31, those parts which are essentially the same as those corresponding parts in FIG. 5B are designated by the same reference numerals, and a description thereof will be omitted. In FIG. 31, $(1+B) \cdot gm$ denotes the mutual conductance of the formula (20).

In the equivalent circuit shown in FIG. 31, the following formulas (21) and (22) stand.

$$I_p = I_{21} + I_{22} \quad (21)$$

$$V_S = I_{21} \cdot R_O + A \cdot V_S = I_{22}/[(1+B) \cdot gm] \quad (22)$$

In addition, the following formula (23) can be obtained because $(1+B) gm \cdot V_S = I_{22}$.

$$I_{21} = (1-A) \cdot I_{22}/[gm \cdot R_O(1+B)] \quad (23)$$

Accordingly, the following formula (24) can be derived by substituting the formula (23) into the formula (21).

$$I_{22} = [gm \cdot R_O(1+B)/(1-A) \cdot I_p]/[1 + gm \cdot R_O(1+B)/(1-A)] \quad (24)$$

When it is assumed that the gain A of the impedance conversion circuit 25 is 0.9 and the gain $-B$ of the negative feedback amplifier 130 is $-10$, it may be seen from the formula (24) that the product $gmR_0$ is greatly improved to $(1+B)/(1-A)$ times, that is, 110 times that of the conventional charge injection circuit shown in FIG. 1A.

FIG. 32 is a circuit diagram showing an embodiment of the circuit construction of the tenth embodiment shown in FIG. 29. In FIG. 32, those parts which are the same as those corresponding parts in FIG. 6 are designated by the same reference numerals, and a description thereof will be omitted.

In FIG. 24, a MOS type FET 135 constitutes an inverting amplifier corresponding to the negative feedback amplifier 130. A gate of the FET 135 is connected to a node connecting the source of the FET 22, the cathode of the photo-voltaic element 21 and the gate of the FET 30. A drain of the FET 135 is connected to a source of a MOS type FET 136 and the gate of the FET 22. The FET 136 acts as a load on the FET 135 and the gate and a drain of the FET 136 are connected to each other. $V_{S1}$ and $V_{S2}$ denote respective power source voltages to the source of the FEt 31 and the source of the FET 135, and $V_{D1}$ and $V_{D2}$ denote respective power source voltages to the drain of the FET 30 and the drain of the FET 136. The gain A of 0.9 can easily be realized by the source follower constituted by the FETs 30 and 31, and the gain $-B$ of $-10$ can easily be realized by the inverting amplifier constituted by the FETs 135 and 136.

FIG. 33 is a cross sectional view showing the construction of an essential part of the circuit shown in FIG. 32. In FIG. 33, those parts which are essentially the same as those corresponding parts in FIG. 7 are designated by the same reference numerals, and a description thereof will be omitted.

In addition to the two p-type wells 36 and 37, a p-type well 143 is formed in the n-type Si substrate 35. $n^+$-type diffusion layers 148, 149 and 150 are formed within the p-type well 143.

The oxide layer 42 made of $SiO_2$, for example, is formed by a known means on the n-type Si substrate 35 which is already formed with the regions described above. Gate electrodes 155 and 156 made of polysilicon and the like are also formed on the n-type Si substrate 35 after the formation of the oxide layer 42.

The drain of the FET 136 corresponds to the $n^+$-type diffusion layer 148. Because the source of the FET 136 and the drain of the FEt 135 always have the same potential, the $n^+$-type diffusion layer 149 is used in common as the source of the FET 136 and the drain of the FEt 135. The source of the FET 135 corresponds to the $n^+$-type diffusion layer 150.

The photocurrent generated when the photo-voltaic element 21 receives the infrared light is supplied from the $n^+$-type diffusion layer 33 to the $n^+$-type diffusion layer 41. The photocurrent supplied to the $n^+$-type diffusin layer 41 then passes through the region of the p-type well 37 immediately below the input gate electrode 45 and is stored as a signal charge in the potential well of the region of the p-type well 37 immediately below the storage gate 46. The $n^+$-type diffusion layer 41, the potential well immediately below the gate electrode 25 and the electrode 26 substantially constitute the FET 22. The signal charge is thereafter transferred to the signal processing circuit (CCD).

The source potential $V_S$ at the $n^+$-type diffusion layer 41 is fed back to the p-type substrate 32 of the photo-voltaic element 21 through the gate electrode 43, the $n^+$-type diffusion layer 39 and the connecting line 48. Furthermore, the source potential $V_S$ is fed back to the input gate electrode 45 through the gate electrode 156, the $n^+$-type diffusion layer 149 and a connection line 158.

In the case of the conventional charge injection circuit shown in FIG. 1A in which the product $gmR_0$ is 0.1, the injection efficiency is in the range of 9%. But according to this embodiment, the injection efficiency is approximately 92% which is ten or more times that obtainable in the conventional charge injection circuit, as may be seen from the coefficient of $I_p$ in the formula (24). As a result, the infrared detector can detect infrared light having a long wavelength and the infrared detector can be operated under a high temperature. Further, the effective product $gmR_0$ can be improved to 100 or more times that of the conventional charge injection circuit.

In this embodiment, it is of course possible to use bipolar transistors in place of the MOS type FETs. In addition, resistors may be used in place of the MOS type FETs which act as loads.

It is possible to provide in one or both of the positive feedback path including the impedance conversion circuit 25 and the negative feedback path including the negative feedback amplifier 130 a lowpass filter having such a cutoff frequency that the input signal component can pass through the lowpass filter. In this case, the injection efficiency is improved with respect to the input signal which passes through the lowpass filter. The gains A and −B substantially become zero in the high frequency region outside the passband of the lowpass filter, and the injection efficiency becomes approximately the same as that of the conventional charge injection circuit shown in FIG. 1A, thereby making it possible to suppress the noise caused by the photo-boltaic element 21 and improve the S/N ratio in the high frequency region.

Therefore, according to this embodiment, it is possible to considerably reduce the white noise which is added by the aliasing effect when the multiplexing takes place in the signal processing circuit (CCD) which horizontally transfers the charge from the FET 22.

The FET 22, the impedance conversion circuit 25, the signal processing circuit (not shown), the lowpass filter (not shown) and the like may be provided on the same substrate.

Further, the present invention is not limited to these embodiments, but various variations and modifications may be made without departing from the scope of the present invention.

What is claimed is:

1. A charge injection circuit for injecting a charge to a signal processing circuit, said charge injection circuit comprising:
   a photo-voltaic element, formed on a substrate to have a first terminal and a second terminal as the substrate, for generating a photocurrent when an infrared light is received;
   a first field effect transistor having a source terminal connected to the first terminal of said photo-voltaic element for injecting the charge to the signal processing circuit, a drain terminal operatively connected to the signal processing circuit, and a gate terminal supplied with a gate voltage; and
   impedance converison means for feeding back a potential at the source terminal of said first field effect transistor to the substrate of said photo-voltaic elements, said impedance conversion means having a gain greater than zero and at most one.

2. A charge injection circuit as claimed in claim 1, wherein said impedance conversion means includes a source follower comprising a second field effect transistor and a load operatively connected in series between first and second poweer source voltages, and
   wherein the load is operatively connected to the substrate of said photo-voltaic element.

3. A charge injection circuit as claimed in claim 1 wherein said first field effect transistor, said impedance conversion means and the signal processing circuit are provided on a single substrate.

4. A charge injection circuit as claimed in claim 1, wherein said charge injection circuit further comprises a lowpass filter provided in a feedback path between said impedance conversion means and the substrate of said photo-voltaic element.

5. A charge injection circuit as claimed in claim 4, wherein said impedance conversion means includes a source follower comprising a second field effect transistor and a load operatively connected in series between first and second power source voltages,
   wherein the load is operatively connected to the substrate of said photo-voltaic element, and
   wherien said lowpass filter comprises a capacitor connected between the substrate and ground.

6. A charge injection circuit as claimed in claim 1, wherein the substrate of said photo-voltaic element includes:
   a first layer of a first semiconductor type having minority carriers with a diffusion length,
   a second layer of a second semiconductor type and forming a pn junction interface therebetween, and
   an ohmic contact portion operatively connected to said impedance conversion means for receiving the feedback of the potential at the source terminal of said first field effect transistor, said ohmic contact portion located at least a predetermined distance away from the pn junction interface, the predetermined distance determined in dependance upon the diffusion length of the minority carriers of the first layer.

7. A charge injection circuit as claimed in claim 1, wherein the substrate of said photo-voltaic element includes:
   a first layer of a first semiconductor type,
   a second layer of a second semiconductor type and forming a pn junction interface therebetween,
   a high carrier density layer of the first semiconductor type formed in the first layer and having a carrier density higher than that of the first layer, and
   an ohmic contact portion connected to said impedance conversion means for receiving the feedback of the potential at the source terminal of said first field effect transistor, said ohmic contact portion in contact with said high carrier density layer.

8. A charge injection circuit as claimed in claim 1, wherein the substrate of said photo-voltaic element includes:
   a semiconductor layer of a first semiconductor type having a wide band gap,
   a first layer of the first semiconductor type and a second layer of a second semiconductor type respectively having a narrow band gap and forming a pn junction interface, and
   an ohmic contact portion connected to said impedance conversion means for receiving the feedback of the potential at the source terminal of said first field effect transistor, said ohmic contact portion in contact with said semiconductor layer.

9. A charge injection circuit as claimed in claim 1, wherein said photo-voltaic element, said first field effect transistor and said impedance conversion circuit are arranged in an array.

10. A charge injection circuit as claimed in claim 1, wherein said charge injection circuit further comprises m by n address switches $SW_{11}$ through $SW_{mn}$ sequentially turned ON in a sequence of a line address, said address switches of identical line addresses being turned ON simultaneously, and wherein said photo-voltaic element, said field effect transistor and said impedance conversion means being arranged in an array respectively having m by n photo-voltaic element cells $PV_{11}$ through $PV_{mn}$, n field effect transistor cells and n impedance conversion circuit cells, a photocurrent generated from the photo-voltaic element cells $PV_{1j}$ through $PV_{mj}$ being supplied to a source terminal of a corresponding field effect transistor through one of the address switches $SW_{1j}$ through $SW_{mj}$ which is ON, where $j = 1, \ldots, n$.

11. A charge injection circuit as claimed in claim 10, wherein said charge injection circuit further comprises a single substrate and n detector element substrates $SUB_1$ through $SUB_n$, said photo-voltaic element cells $PV_{1j}$ through $PV_{mj}$ arranged in a direction perpendicular to a line address direction being provided on a common detector element substrate $SUB_j$ out of said n detector element substrates, where $j = 1, \ldots, n$, the photo-voltaic element cells arranged in the line address direction being provided on mutually different detector element substrates, said address switches, said impedance conversion circuit cells and said field effect transistor cells being provided on said single substrate, each impedance conversion circuit cell making a positive feedback to a corresponding one of said detector element substrates.

12. A charge injection circuit as claimed in claim 1, wherein said signal processing circuit includes a charge coupled device.

13. A charge injection circuit for injecting a charge to a signal processing circuit, said charge injection circuit comprising:
- a photo-voltaic element, formed on a substrate to have a first terminal and a second terminal as the substrate, for generating a photocurrent when an infrared light is received;
- a first field effect transistor having a gate terminal connected to the first terminal of said photo-voltaic element for injecting the charge to the signal processing circuit, a drain terminal operatively connected to the signal processing circuit, and a source terminal connected to ground; and
- impedance conversion means for feeding back a potential at a first node connecting the cathode said photo-voltaic element and the gate terminal of said first field effect transistor to the substrate of said photo-voltaic element, said impedance conversion means having a gain greater than zero and at most one.

14. A charge injection circuit as claimed in claim 13, wherein said impedance conversion means includes a source follower comprising a second field effect transistor and a load operatively connected in series between first and second power source voltages, and
wherein the load is operatively connected to the substrate of said photo-voltaic element.

15. A charge injection circuit for injecting a charge to a signal processing circuit, said charge injection circuit comprising:
- a photo-voltaic element, formed on a substrate to have a first terminal and a second terminal as the substrate, for generating a photocurrent and an output voltage when an infrared light is received;
- a first load connected between a power source voltage and said photo-voltaic element for biasing said photo-voltaic element;
- a capacitor having first and second terminals, the first terminal connected to a node connecting said photo-voltaic element and said first load;
- a first field effect transistor having a gate terminal connected to the second terminal of said capacitor for injecting the charge to the signal processing circuit, a drain terminal operatively connected to the signal processing circuit, and a source terminal connected to ground; and
- impedance conversion means for feeding back the output voltage of said photo-voltaic element to the substrate of said photo-voltaic element, said impedance conversion means having a gain greater than zero and at most one.

16. A charge injection circuit as claimed in claim 15, wherein said impedance conversion means includes a source follower comprising a second field effect transistor and a second load operatively connected in series between first and second power source voltages, and the second load operatively connected to the substrate of said photo-voltaic element.

17. A charge injection circuit as claimed in claim 15, wherein said impedance conversion means has a high input impedance and a low output impedance.

18. A charge injection circuit for injecting a charge to a signal processing circuit, said charge injection circuit comprising:
- a photo-voltaic element, formed on a substrate to have a first terminal and a second terminal as the substrate, for generating a photocurrent when an infrared light is received;
- a first field effect transistor having a source terminal connected to the first terminal of said photo-voltaic element for injecting the charge to the signal processing circuit, a drain terminal operatively connected to the signal processing circuit, and a gate terminal;
- impedance conversion means for feeding back a potential at the source terminal of said first field effect transistor to the substrate of said photo-voltaic element, said impedance conversion means having a gain greater than zero and at most one; and
- a negative feedback amplifier connected between the gate terminal of said first field effect transistor and a first node connecting said photo-voltaic element and said impedance conversion means for negative feedback of the potential at the source terminal to the gate terminal of said first field effect transistor, said negative feedback amplifier having a gain greater than one and less than infinity.

19. A charge injection circuit as claimed in claim 18, wherein said impedance conversion means includes a source follower comprising a second field effect transistor and a load operatively connected in series between first and second power source voltages, and
wherein the load is operatively connected to the substrate of said photo-voltaic element.

20. A charge injection circuit as claimed in claim 18, wherein said impedance conversion means has a high input impedance and a low output impedance.

21. A charge injection circuit for injecting a charge to a signal processing circuit, said charge injection circuit comprising:

a photo-voltaic element, formed on a substrate to have a first terminal and a second terminal as the substrate, for generating a photo current when an infrared light is received;

a first field effect transistor having a source terminal connected to the first terminal of said photo-voltaic element for injecting the charge to the signal processing circuit, a drain terminal operatively connected to the signal processing circuit, and a gate terminal supplied with a gate voltage; and impedance conversion means for feeding back a potential at the source terminal of said first field effect transistor to the substrate of said photo-voltaic element, said impedance conversion means having a gain greater than zero and less than or equal to one.

22. A charge injection circuit according to claim 21, wherein said impedance conversion means has a gain greater than zero and less than one.

* * * * *

UNITED STATES PATENT AND TRADEMARK OFFICE
CERTIFICATE OF CORRECTION

PATENT NO.   : 5,093,589
DATED        : March 3, 1992
INVENTOR(S)  : Yoshiro MIYAMOTO et al.

It is certified that error appears in the above-identified patent and that said Letters Patent is hereby corrected as shown below:

Column 22, line 49, after "substrate"

insert --potential) of the photo-voltaic element 21 through the--.

Column 23, Equation 17 (first line), before

"$\Delta I_{ds}$" insert --$\Delta I \approx$ --.

Column 24, line 13, change "FEt" to --FET--.

Column 24, line 42, change "FEt" to --FET--.

Column 25, line 60, change "elements"

to --element--.

Signed and Sealed this

Tenth Day of August, 1993

Attest:

MICHAEL K. KIRK

*Attesting Officer*      *Acting Commissioner of Patents and Trademarks*